US00RE49525E

(19) United States
(12) Reissued Patent
Bae et al.

(10) Patent Number: US RE49,525 E
(45) Date of Reissued Patent: May 9, 2023

(54) SEMICONDUCTOR DEVICE HAVING GATE ELECTRODE WITH SPACERS ON FIN STRUCTURE AND SILICIDE LAYER FILLING THE RECESS

(71) Applicant: Samsung Electronics Co., Ltd., Suwon-si (KR)

(72) Inventors: Dong-Il Bae, Incheon (KR); Bomsoo Kim, Seoul (KR); Yong-Min Cho, Suwon-si (KR)

(73) Assignee: SAMSUNG ELECTRONICS CO., LTD., Suwon-si (KR)

(21) Appl. No.: 16/986,448

(22) Filed: Aug. 6, 2020

Related U.S. Patent Documents

Reissue of:
(64) Patent No.: 9,525,036
Issued: Dec. 20, 2016
Appl. No.: 14/662,697
Filed: Mar. 19, 2015

(51) Int. Cl.
*H01L 29/66* (2006.01)
*H01L 29/786* (2006.01)
(Continued)

(52) U.S. Cl.
CPC ..... *H01L 29/6656* (2013.01); *B82Y 10/00* (2013.01); *H01L 21/308* (2013.01); *H01L 29/0673* (2013.01); *H01L 29/41791* (2013.01); *H01L 29/42392* (2013.01); *H01L 29/45* (2013.01); *H01L 29/66439* (2013.01); *H01L 29/66795* (2013.01); *H01L 29/775* (2013.01); *H01L 29/785* (2013.01);
(Continued)

(58) Field of Classification Search
CPC ..... H01L 29/6656; H01L 29/78696; H01L 29/66795; H01L 29/66439; H01L 29/42392; H01L 29/0673; H01L 29/785; H01L 29/41791; H01L 29/45; H01L 21/308; H01L 29/775; H01L 29/66545; H01L 29/7848; H01L 27/1104; H01L 29/165; B82Y 10/00
See application file for complete search history.

(56) References Cited

U.S. PATENT DOCUMENTS 8,278,179 B2 * 10/2012 Lin ..... H01L 29/66795 438/305
9,525,036 B2 12/2016 Bae et al.
(Continued)

FOREIGN PATENT DOCUMENTS

JP 2004327961 11/2004
KR 10-2005-00069478 7/2005
(Continued)

*Primary Examiner* — Minh Nguyen
(74) *Attorney, Agent, or Firm* — F. Chau & Associates, LLC

(57) ABSTRACT

An semiconductor device is provided. A fin is disposed on a substrate, extending in a lengthwise direction. A first recess is disposed on a sidewall of the fin so that the fin and the first recess is arranged in a straight line along the lengthwise direction. A gate structure crosses the fin in the first direction crossing the lengthwise direction. A spacer is disposed on sidewalk of the gate structure. A source/drain region is disposed in the first recess. The source/drain region is formed under the spacer. A silicide layer is disposed on the source/drain region. The silicide layer and the source/drain region fill the first recess.

20 Claims, 31 Drawing Sheets

(51) Int. Cl.

| | |
|---|---|
| ***H01L 29/423*** | (2006.01) |
| ***H01L 29/417*** | (2006.01) |
| ***H01L 29/06*** | (2006.01) |
| ***H01L 29/78*** | (2006.01) |
| ***H01L 29/45*** | (2006.01) |
| ***H01L 21/308*** | (2006.01) |
| ***H01L 29/775*** | (2006.01) |
| ***B82Y 10/00*** | (2011.01) |
| *H01L 27/11* | (2006.01) |
| *H01L 29/165* | (2006.01) |

(52) U.S. Cl.
CPC .... *H01L 29/7848* (2013.01); *H01L 29/78696* (2013.01); *H01L 27/1104* (2013.01); *H01L 29/165* (2013.01)

(56) References Cited

U.S. PATENT DOCUMENTS

| | | | | |
|---|---|---|---|---|
| 2005/0035408 | A1 | 2/2005 | Wang et al. | |
| 2008/0001187 | A1 | 1/2008 | Booth et al. | |
| 2011/0127611 | A1* | 6/2011 | Lee | H01L 29/66795 257/368 |
| 2011/0223736 | A1 | 9/2011 | Lin et al. | |
| 2011/0266622 | A1 | 11/2011 | Luning et al. | |
| 2012/0193712 | A1 | 8/2012 | Bryant et al. | |
| 2012/0193713 | A1 | 8/2012 | Kulkarni et al. | |
| 2013/0175620 | A1 | 7/2013 | Cai et al. | |
| 2014/0346605 | A1* | 11/2014 | Zeitzoff | H01L 29/41791 257/368 |
| 2015/0035074 | A1* | 2/2015 | Obradovic | H01L 29/41791 257/369 |
| 2016/0276449 | A1 | 9/2016 | Bae et al. | |

FOREIGN PATENT DOCUMENTS

| | | |
|---|---|---|
| KR | 10-2006-0077028 | 7/2006 |
| KR | 10-2007-0028061 | 3/2007 |
| KR | 10-2008-0061024 | 7/2008 |
| KR | 10-2013-0088704 | 8/2013 |
| KR | 10-2014-0097521 | 8/2014 |
| KR | 10-2014-0109036 | 9/2014 |
| KR | 10-2014-0112363 | 9/2014 |

* cited by examiner

SEMICONDUCTOR DEVICE HAVING GATE ELECTRODE WITH SPACERS ON FIN STRUCTURE AND SILICIDE LAYER FILLING THE RECESS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*RELATED APPLICATION*

*This is a reissue application from U.S. Pat. No. 9,525,036, issued on Dec. 20, 2016, the disclosure of which is incorporated by reference herein in its entirety.*

TECHNICAL FIELD

The present inventive concept relates to a semiconductor device and a method for fabricating the same.

DISCUSSION OF RELATED ART

Multi-gate transistors include a fin- or nanowire-shaped silicon body formed on a substrate. Gate electrodes of the multi-gate are formed on the silicon body.

Such multi-gate transistors include a three-dimensional (3D) channel which allows the multi-gate transistors to be scaled down without degrading device performance. Current controlling capability of the multi-gate transistors can be increased without increasing gate width of the multi-gate transistors. A short channel effect (SCE), in which an electric potential of a channel region is affected by a drain voltage, can be suppressed in the multi-gate transistors.

SUMMARY

According to an exemplary semiconductor device, a fin is disposed on a substrate, extending in a lengthwise direction. A first recess is disposed on a sidewall of the fin so that the fin and the first recess is arranged in a straight line along the lengthwise direction. A gate structure crosses the fin in the first direction crossing the lengthwise direction. A spacer is disposed on sidewalls of the gate structure. A source/drain region is disposed in the first recess. The source/drain region is formed under the spacer. A silicide layer is disposed on the source/drain region. The silicide layer and the source/drain region fill the first recess.

According to an exemplary method of fabricating a semiconductor device, a preliminary fin extending lengthwise is formed on a substrate. A dummy gate structure crossing the preliminary fin is formed. A first spacer is formed on sidewalls of the dummy gate structure. The preliminary fin is etched using the dummy gate as a etch mask to form a fin and a trench. The fin is formed under the dummy gate structure and the first spacer. A preliminary source/drain region is formed in the trench. The preliminary source/drain region completely fills the trench. A second spacer is formed on the first spacer and the preliminary source/drain region. A first recess is formed by etching the preliminary source/drain region using the second spacer as a etch mask. A silicide layer is formed in the first recess.

According to an exemplary semiconductor device, a fin is disposed on a substrate. The fin includes a first fin protrusion and a second fin protrusion. A first recess is disposed between the first fin protrusion and the second fin protrusion. The first recess, the first fin protrusion and the second fin protrusion are arranged in a straight line along a first direction. A first gate structure and a second gate structure cross the first fin and the second fin in a second direction crossing the first direction, respectively. A first spacer and a second spacer formed on inner sidewalls of the first gate structure and the second gate structure, respectively. The inner sidewalk face each other through the first recess. A source/drain region is disposed in the first recess. One end of the source/drain region is disposed under the first spacer and another end of the source drain/region is disposed under the second spacer. A silicide layer is disposed on the source/drain region. The silicide layer and the source/drain region fill the first recess.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
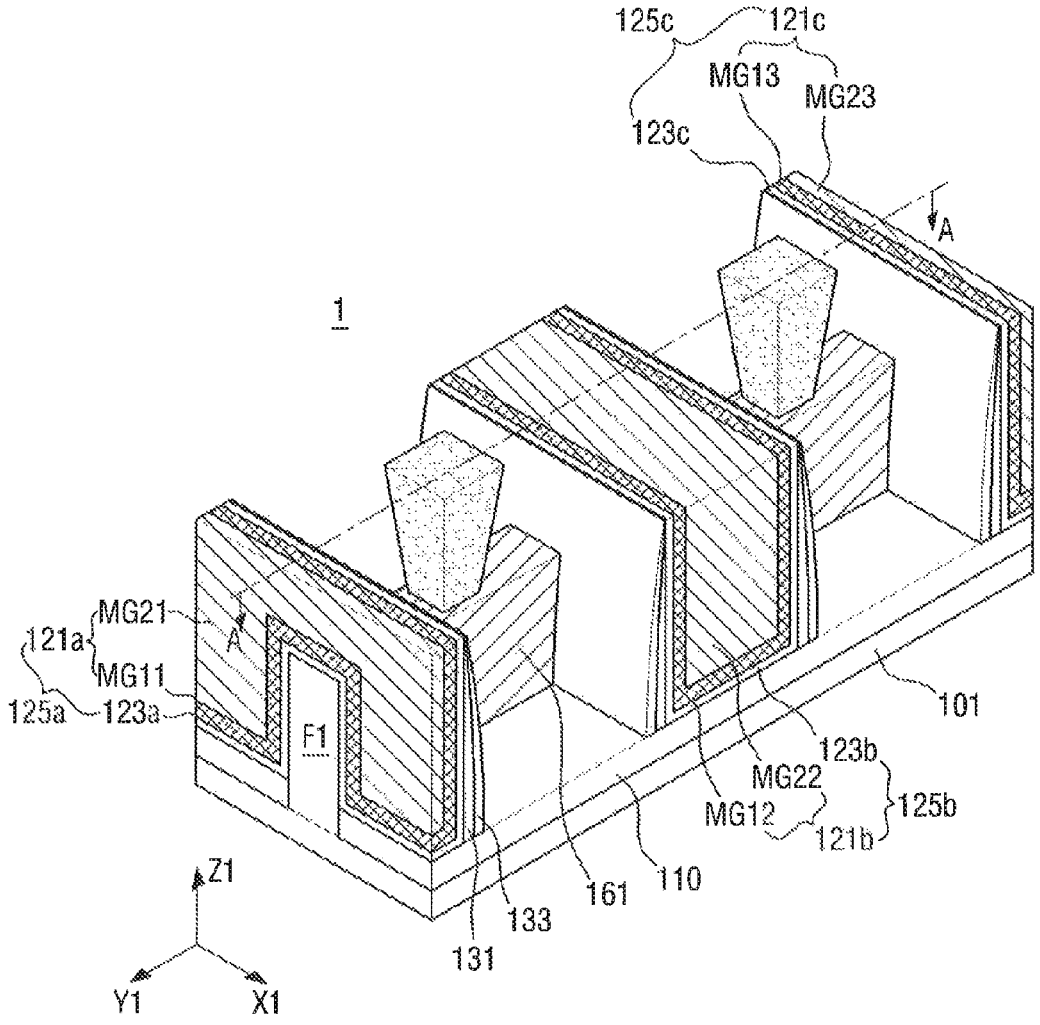
FIG. 1 is a perspective view of a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being on another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, a semiconductor device 1 according to an exemplary embodiment of the present inventive concept will be described with reference to FIGS. 1 and 2.

Figure 2A:
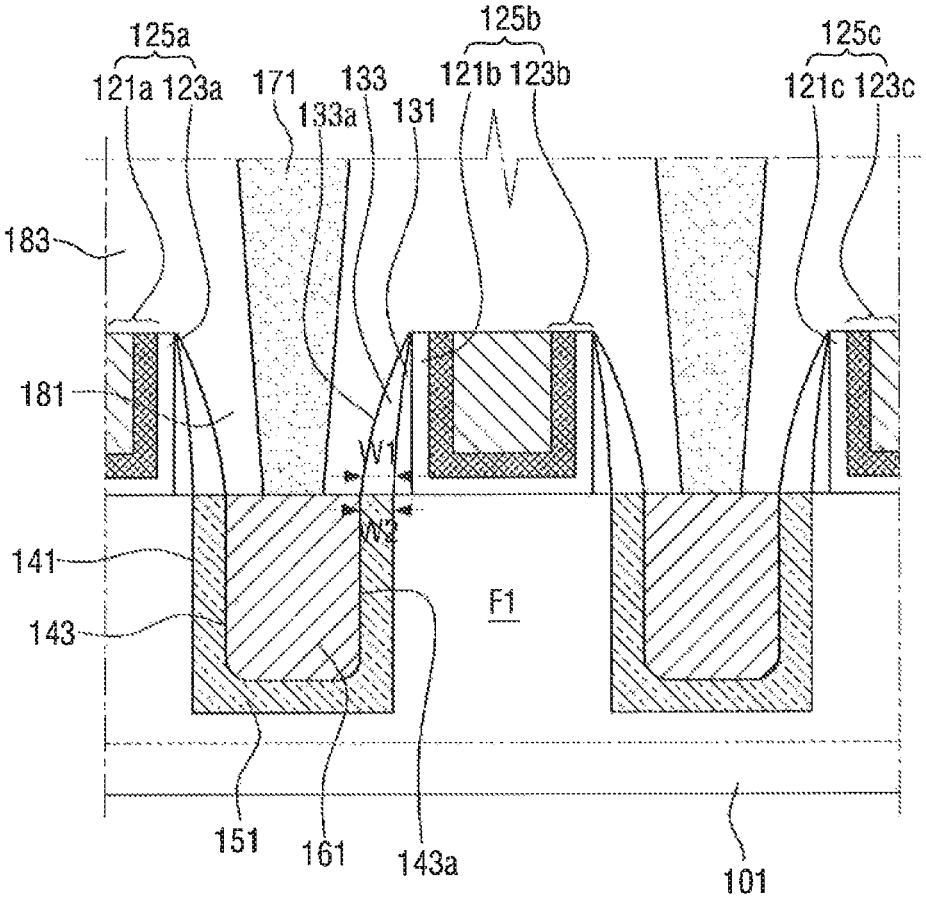
FIGS. 2a and 2b is a cross-sectional view taken along line A-A of FIG. 1.
Figure 2B:
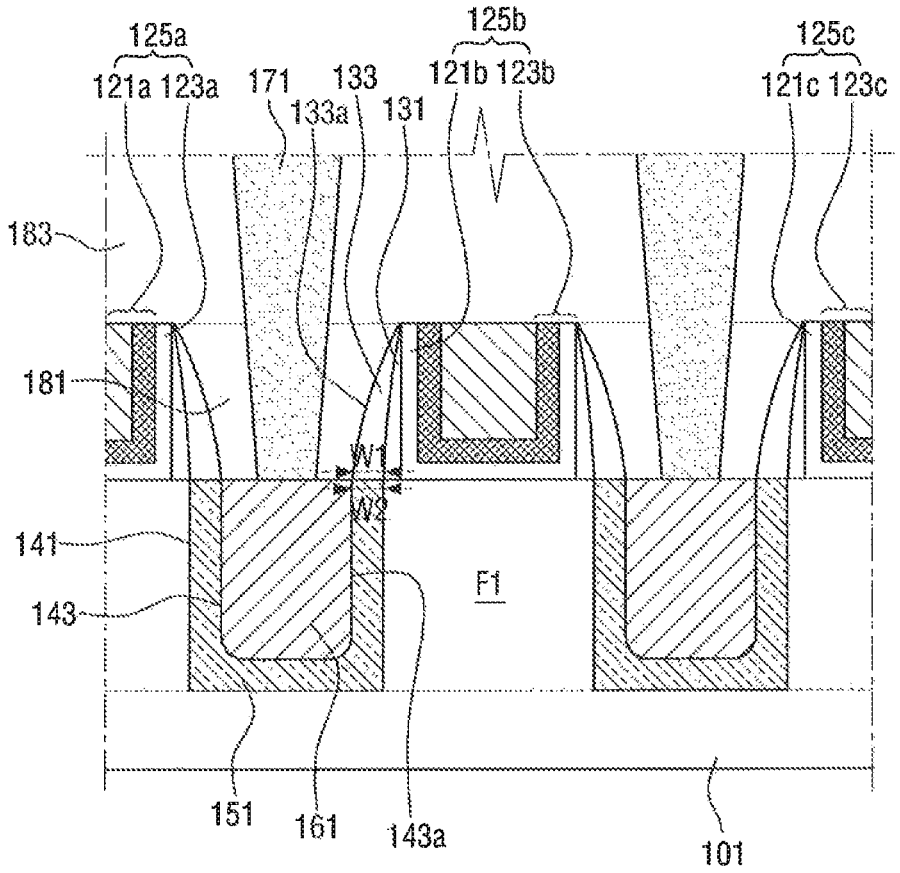

FIG. 1 is a perspective view of a semiconductor device 1 according to an exemplary embodiment of the present inventive concept and FIGS. 2a and 2b is a cross-sectional view taken along line A-A of FIG. 1. In FIG. 1, first and second interlayer insulation layers 181 and 183 are not illustrated for the convenience of a description.

Referring to FIGS. 1 and 2a, the semiconductor device 1 according to an exemplary embodiment of the present inventive concept includes a substrate 101, a fin F1, a field insulation layer 110, first to third gate structures 125a, 125b and 125c, first and second spacers 131 and 133, a source/drain region 151, a silicide layer 161, a contact 171, a first interlayer insulation layer 181 and a second interlayer insulation layer 183.

The substrate 101 may include at least one of Si, Ge, SiGe, GaP, GaAs, SiC, SiGeC, InAs and MP. Alternatively, the substrate 101 may include a silicon on insulator (SOI) substrate.

The fin F1 extends in a lengthwise direction, for example, in a second direction Y1. The fin F1 has long sides and short sides. In FIG. 1, the long sides extend in the second direction Y1 and the short sides extend in a first direction X1. The present inventive concept, however, is not limited thereto. For example, the long sides may extend in the first direction X1 and the short sides may extend in the second direction Y1. The fin F1 protrudes from the substrate 101 in a third direction Z1.

The fin F1 may be part of the substrate 101 or may include an epitaxial layer grown from the substrate 101. The fin F1 may include, for example, Si or SiGe. The field insulation layer 110 is formed on the substrate 101, exposing a top portion of the fin F1 and covering portions of sidewalk of the fin F1 in the long sides.

The first to third gate structures 125a, 125b and 125c are spaced apart from one another. The first to third gate structures 125a, 125b and 125c are disposed on the fin F1 and each of the first to third gate structures 125a, 125b and 125c crosses the fin F1, for example, in the first direction X1 at a right angle with respect to the second direction Y1. The present inventive concept is not limited thereto. For example, the first to third gate structures 125a, 125b and 125c may cross the fin F1 at an acute angle or an obtuse angle with respect to a lengthwise direction of the fin F1.

The first to third gate structures 125a, 125b and 125c include first to third gate electrodes 121a, 121b and 121c and first to third gate insulation layers 123a, 123b and 123c, respectively.

The first to third gate electrodes 121a, 121b and 121c include first sub metal layers MG11 to MG13 and second sub metal layers MG21 to MG23, respectively. The first sub metal layers MG11, MG12 and MG13 may control a work function, and the second sub metal layers MG21, MG22 and MG23 may fill spaces produced by the first sub metal layers MG11, MG12 and MG13. For example, the first sub metal layers MG11, MG12 and MG13 may include at least one of TiN, TaN, TiC, TiAlC and TaC. In addition, the second sub metal layers MG21, MG22 and MG23 may include W or Al. In addition, the first to third gate electrodes 121a, 121b and 121c may include a non-metal material, e.g., Si or SiGe. The first to third gate electrodes 121a, 121b and 121c may be formed by, for example, a replacement process. The present inventive concept is not limited thereto.

The first to third gate insulation layers 123a, 123b and 123c are formed between the fin F1 and each of the first to third gate electrodes 121a, 121b and 121c, respectively. As shown in FIG. 2a, the first to third gate insulation layers 123a, 123b and 123c are formed on a top surface and top portions of side surfaces of the fin F1. In addition, the first to third gate insulation layers 123a, 123b and 123c are disposed between each of the first to third gate electrodes 121a, 121b and 12c and the field insulation layer 110. The first to third gate insulation layers 123a, 123b and 123c may include a high-k material having a higher dielectric constant than a silicon oxide layer. For example, the first to third gate insulation layers 123a, 123b and 123c may include $HfO_2$, $ZrO_2$, LaO, $Al_2O_3$ or $Ta_2O_5$.

The first and second spacers 131 and 133 are formed on sidewalls of the first to third gate electrodes 121a, 121b and 121c. For example, the first spacer 131 is disposed on the sidewalls of the first to third gate electrodes 121a, 121b and 121c and the second spacer 133 is disposed on the sidewalls of the first spacer 131. The first spacer 131 is interposed between each of the first to third gate electrodes 121a, 121b and 121c and the second spacer 133.

The first and second spacers 131 and 133 may include at least one of a nitride layer and an oxynitride layer. The first and second spacers 131 and 133 may include a single layer or multiple layers.

The source/drain region 151 is disposed between the first to third gate structures 125a, 125b and 125c. For example, the source/drain region 151 is disposed on at least one side of each of the first to third gate structures 125a, 125b and 125c. The source/drain region 151 is disposed within the fin F1. For example, the fin F1 includes a trench 141 formed therein, and the source/drain region 151 is disposed within the trench 141. The trench 141 formed in the fin F1 exposes a top surface of the substrate 101. Therefore, the source/drain region 151 is in contact with the substrate 101. The present inventive concept, however, is not limited thereto. For example, the trench 141 need not expose the surface of the substrate 101.

The source/drain region 151 defines a first recess 143, having a U-shaped structure in view of a cross section of the second direction Y1, i.g., a cross section taken along line A-A of FIG. 1.

A top surface of the source/drain region 151 is in contact with the second spacer 133. For example, a side surface 143a of the source/drain region is connected to a side surface 133a of the second spacer 133 without forming a step difference at the boundary of the first and the second spacers 131 and 133a. For example, a top surface width W2 of the source/drain region 151 is substantially equal to a bottom surface width W1 of the second spacer 133. Such structure may be formed using a manufacturing method to be described below. The present inventive concept, however, is not limited thereto. For example, the top surface width W2 of the source/drain region 151 may be smaller than the bottom surface width W1 of the second spacer 133. Therefore, a distance between the top surface of the source/drain region 151 and the bottom surface of the first, second or third gate structure 125a, 125b, 125c may be greater than or equal to a width of a bottom surface of the first spacer 131. The source/drain region 151 and the first to third gate electrodes 125a, 125b and 125c are spaced apart from each other without being in contact with each other.

When the semiconductor device 1 is a p-type metal oxide semiconductor (PMOS) transistor, the source/drain region 151 may include a compressive stress material. For example, the compressive stress material may include a material having a larger lattice constant than silicon (Si), for example, SiGe. The compressive stress material may serve to increase the mobility of carriers of a channel region by applying compressive stress to the channel region under the first to third gate structures 125a, 125b and 125c.

When the semiconductor device 1 is an n-type metal oxide semiconductor (NMOS) transistor, the source/drain region 151 may include the same material as the substrate 101 or a tensile stress material. For example, when the substrate 101 includes Si, the source/drain region 151 may include Si or a material having a smaller lattice constant than Si (e.g., SiC or SiP).

The source/drain region 151 may be formed through epitaxial growth.

The silicide layer 161 is disposed within the first recess 143 of the source/drain region 151. The silicide layer 161 fills the first recess 143. Therefore, a bottom surface of the silicide layer 161 is lower than the top surface of the fin F1. The bottom surface of the silicide layer 161 is nearer to a top surface of the substrate 100 than the top surface of the fin F1. Referring to FIG. 2b, the bottom surface of the silicide layer 161 may contact with the top surface of the substrate 100. In this case, the source/drain region 151 may not be formed on the bottom surface of the trench 141. The silicide layer 161 may serve to reduce surface resistance or contact resistance of the source/drain region 151 and may include a conductive material, for example, Pt, Ni, or Co.

The contact 171 is formed on the silicide layer 161. The contact 171 is disposed between two neighboring gate electrode of the first to third gate structures 125a, 125b and 125c. The contact 171 has a decreasing width downwardly. The inventive concept, however, is not limited thereto. For example, the contact 171 may have a uniform width from a top portion to a bottom portion thereof.

The contact 171 may include a conductive material, for example, W, Al or Cu, but is not limited thereto.

The first interlayer insulation layer 181 and the second interlayer insulation layer 183 are sequentially formed on the field insulation layer 110. The first interlayer insulation layer 181 may cover the silicide layer 161 and portions of sidewalk of the contact 171. The second interlayer insulation layer 183 may cover the remaining portions of the sidewalls of the contact 171.

As shown in FIG. 2a, a top surface of the first interlayer insulation layer 181 is positioned on substantially the same plane with top surfaces of the first to third gate structures 125a, 125b and 125c. The top surface of the first interlayer insulation layer 181 and the top surfaces of the first to third gate electrodes 125a, 125b and 125c are coplanar with each other through planarization using, for example, a chemical-mechanical planarization (CMP) process. The second interlayer insulation layer 183 covers the first to third gate electrodes 125a, 125b and 125c. The first interlayer insulation layer 181 and the second interlayer insulation layer 183 may include at least one of an oxide layer, a nitride layer and an oxynitride layer.

Figure 3:
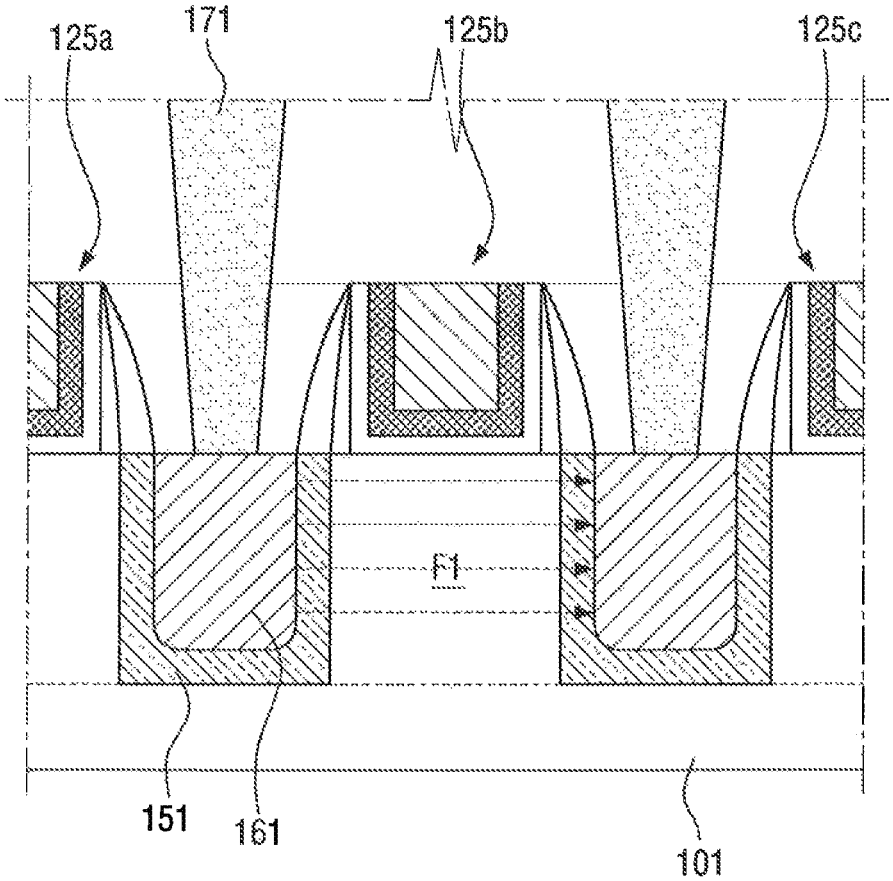
FIG. 3 illustrates effects of the semiconductor device shown in FIG. 1.

Effects of the semiconductor device 1 shown in FIG. 1 will now be described with reference to FIG. 3. FIG. 3 illustrates effects of the semiconductor device shown in FIG. 1.

In the semiconductor device 1 shown in FIG. 1, the silicide layer 161 is formed to extend vertically from a top surface of the fin F1 to the substrate 101. Therefore, in a case where current flows in a channel region, as indicated by the arrow of FIG. 3, the current flow may be uniformly distributed throughout the channel area. Therefore, in the semiconductor device 1 shown in FIG. 1, a current crowding effect (CCE) may be reduced.

In addition, since the resistance of the silicide layer 161 is lower than the resistance of the source/drain region 161 and the resistance of the fin F1, the resistance of transistor is reduced.

Hereinafter, a semiconductor device 2 according to an exemplary embodiment of the present inventive concept will be described with reference to FIGS. 4 and 5. For the convenience of description, description of the same elements as in the semiconductor device 1 of FIG. 1 will be omitted, and the following description will focus on differences between the semiconductor devices 1 and 2.

Figure 4:
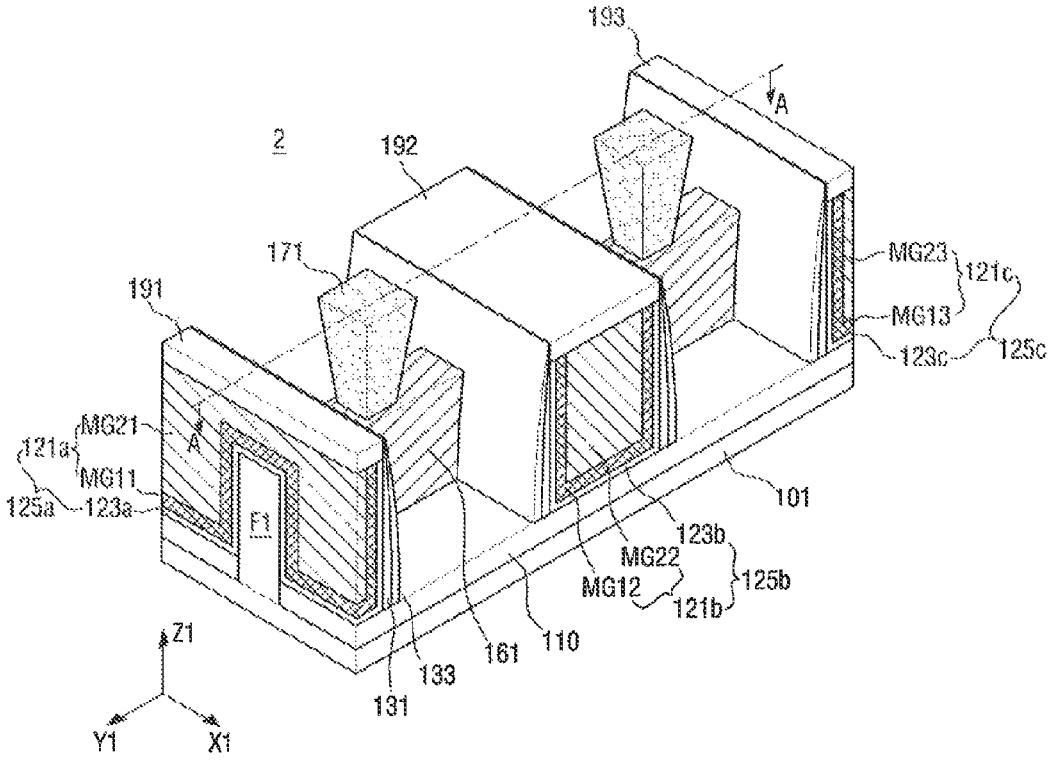
FIG. 4 is a perspective view of a semiconductor device according to an exemplary embodiment of the present inventive concept.
Figure 5:
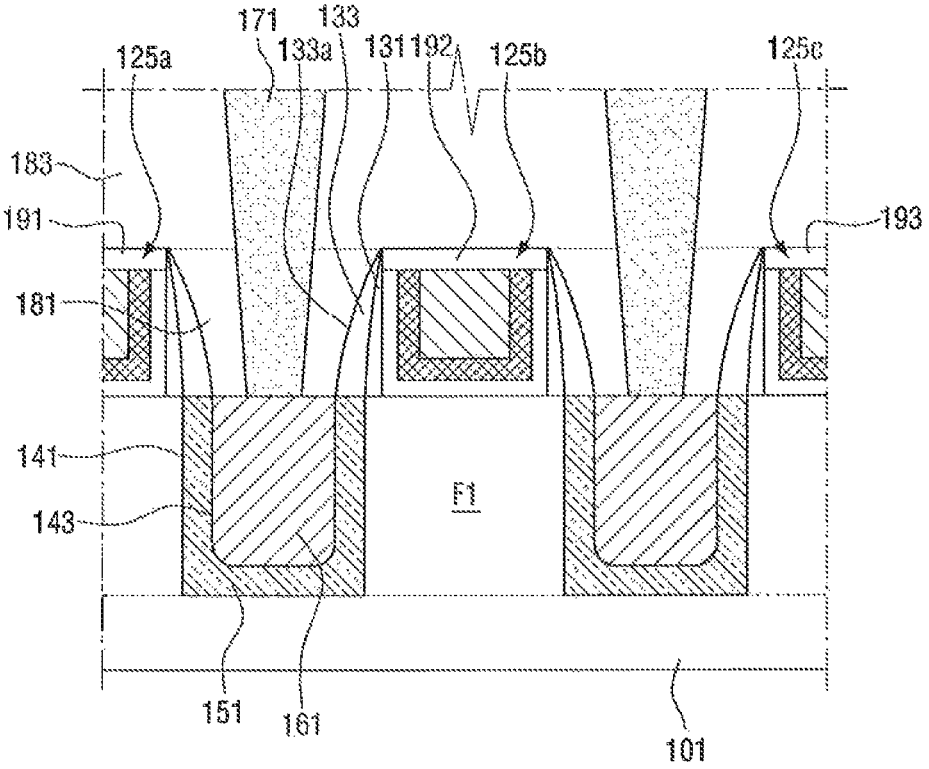
FIG. 5 is a cross-sectional view taken along line A-A of FIG. 4.

FIG. 4 is a perspective view of a semiconductor device 2 according to an exemplary embodiment of the present inventive concept, and FIG. 5 is a cross-sectional view taken along line A-A of FIG. 4. In FIG. 4, first and second interlayer insulation layers 181 and 183 are not shown for the convenience of description.

In the semiconductor device 2 shown in FIG. 4, first to third capping layers 191, 192 and 193 are disposed on first to third gate structures 125a, 125b and 125c, respectively. The first to third capping layers 191, 192 and 193 may serve to suppress the first to third gate structures 125a, 125b and 125c from being affected by external factors. In addition, in a case where a contact 171 is misaligned, the first to third capping layers 191, 192 and 193 may prevent the first to third gate structures 125a, 125b and 125c from being in contact with the contact 171, thereby avoiding a failure of the semiconductor device 2.

The first to third capping layers 191, 193 and 195 may include, for example, at least one of an oxide layer, a silicon nitride (SiN) layer, and so on.

Hereinafter, a semiconductor device 3 according to an exemplary embodiment of the present inventive concept will be described with reference to FIGS. 6 and 7. For the convenience of description, description of the same elements as in the semiconductor device 1 of FIG. 1 will be omitted, and the following description will focus on differences between the semiconductor devices 1 and 3.

Figure 6:
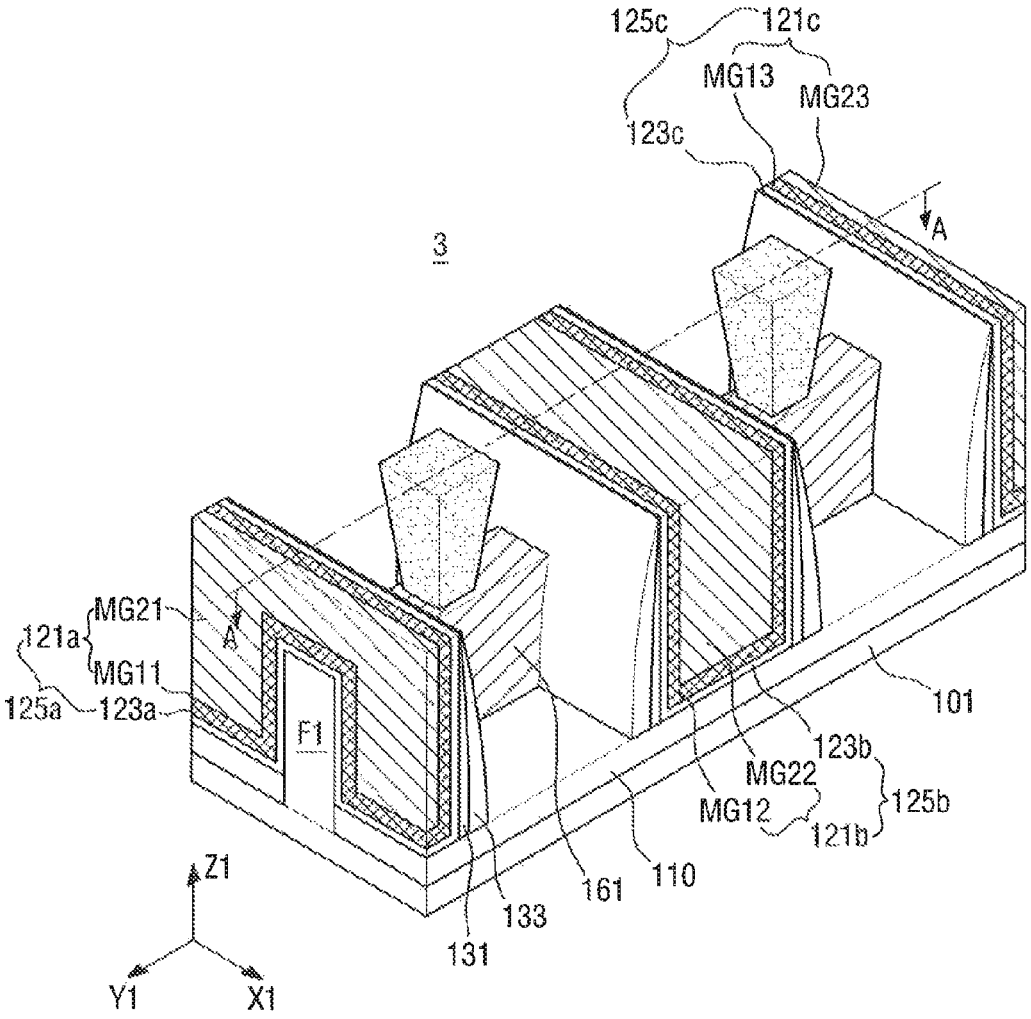
FIG. 6 is a perspective view of a semiconductor device according to an exemplary embodiment of the present inventive concept.
Figure 7:
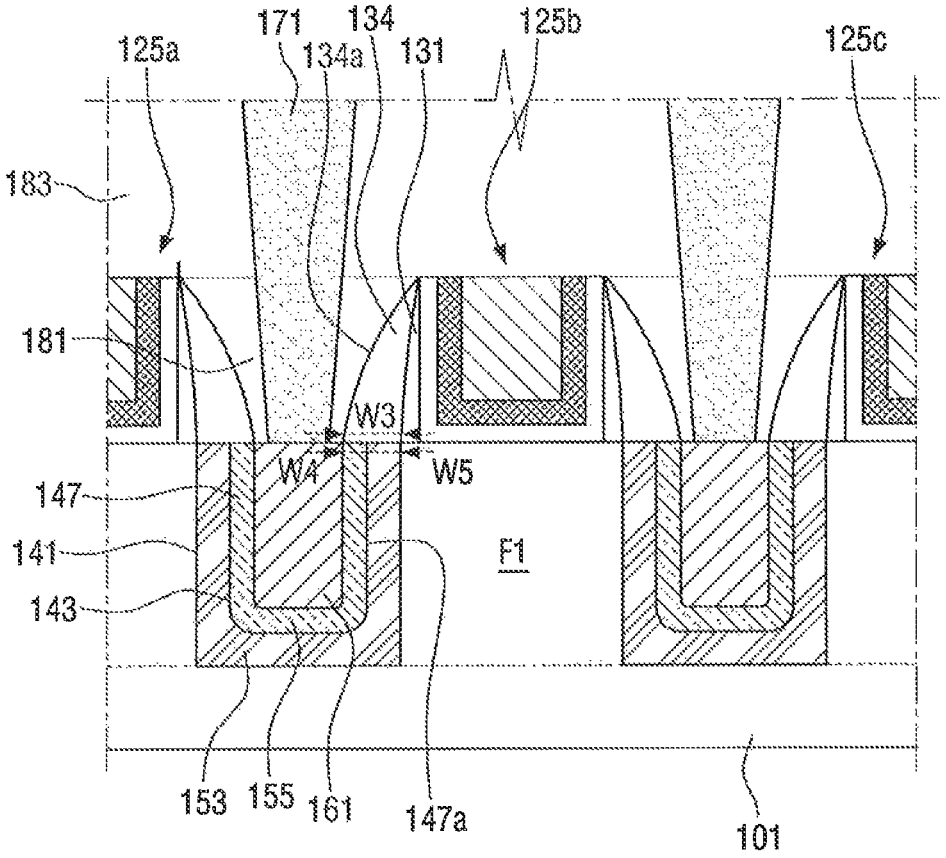
FIG. 7 is a cross-sectional view taken along line A-A of FIG. 6.

FIG. 6 is a perspective view of a semiconductor device 3 according to an exemplary embodiment of the present inventive concept, and FIG. 7 is a cross-sectional view taken along line A-A of FIG. 6. In FIG. 6, first and second interlayer insulation layers 181 and 183 are not shown for the convenience of description.

In the semiconductor device 3 shown in FIG. 6, unlike in the semiconductor device 1 shown in FIG. 1, a source/drain region is formed in multiple layers. Referring to FIG. 7, a first source/drain region 153, a third source/drain region 155, and a silicide layer 161 are disposed in a trench 141. The first source/drain region 153 may be conformally formed along sidewalls and a bottom surface of the trench 141 formed in a fin F1. The source/drain region 153 defines a second recess 145. The second source/drain region 155 is disposed in the second recess 145. For example, the second source/drain region 155 may be conformally formed along sidewalls and a bottom surface of the first recess 145. The second source/drain region 155 defines a third recess 147. A silicide layer 161 is formed in the third recess 147.

Top surfaces of the first and second source/drain regions 153 and 155 are in contact with a bottom surface of a second spacer 134. In addition, a width W3 of the bottom surface of the second spacer 134 is greater than or equal to a sum of a width W5 of the top surface of the first source/drain region 153 and a width W4 of the top surface of the second source/drain region 155.

A side surface 134a of the second spacer 134a is connected to an inner side surface 147a of the second source/drain region 155 without forming a step at the boundary between the second spacer 134a and the second source/drain region 155.

The first source/drain region 153 and the second source/drain region 155 may be formed by epitaxial growth and may include a first material. For example, the first material may be doped in the first/drain region 153 and the second source/drain region 155. The first material may be referred to as a first impurity. A concentration of the first material included in the first source/drain region 153 may be different from a concentration of the first material included in the second source/drain region 155. For example, the concentration of the first material included in the second source/drain region 155 may be higher than the concentration of the first material included in the first source/drain region 153. Forming source/drain regions using the first material having different concentrations makes it possible to prevent a defect from being formed and facilitates the forming of the source/drain regions. Here, the first material may include, for example, Ge.

Hereinafter, a semiconductor device 4 according to an exemplary embodiment of the present inventive concept will be described with reference to FIGS. 8 and 9. For the convenience of description, description of the same elements as in the semiconductor device 1 of FIG. 1 will be omitted, and the following description will focus on differences between the semiconductor devices 1 and 4.

Figure 8:
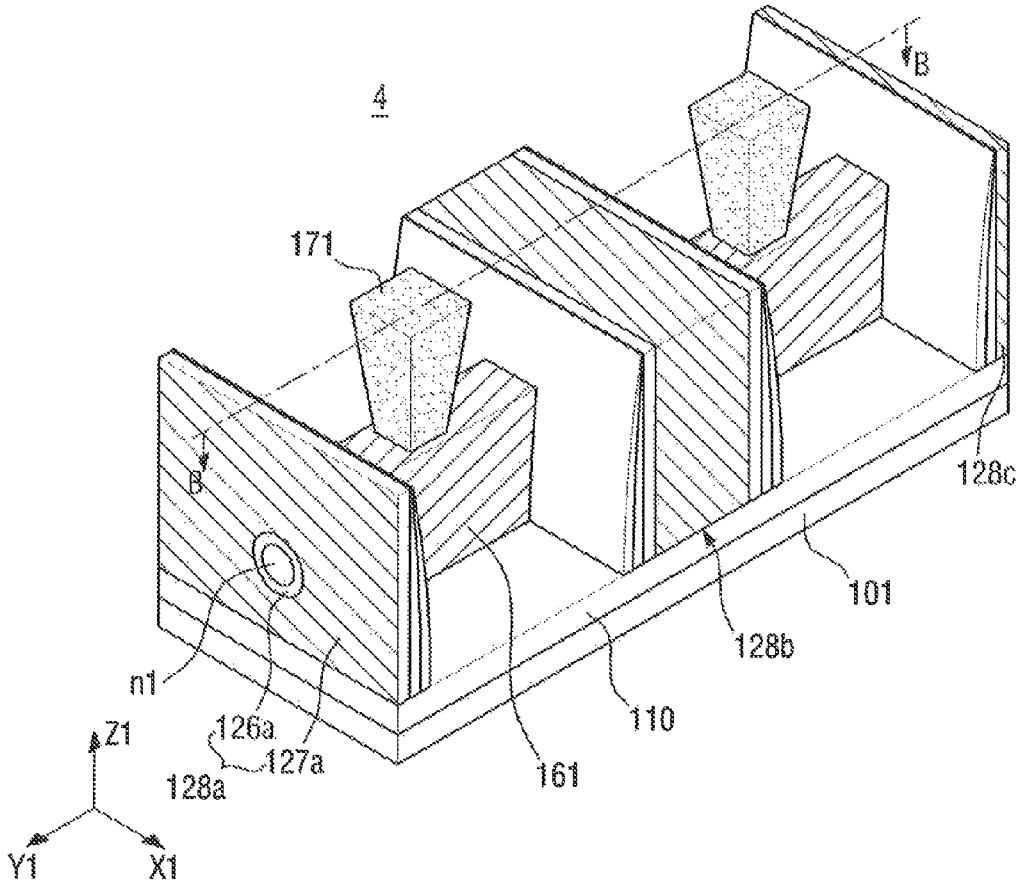
FIG. 8 is a perspective view of a semiconductor device according to an exemplary embodiment of the present inventive concept.
Figure 9:
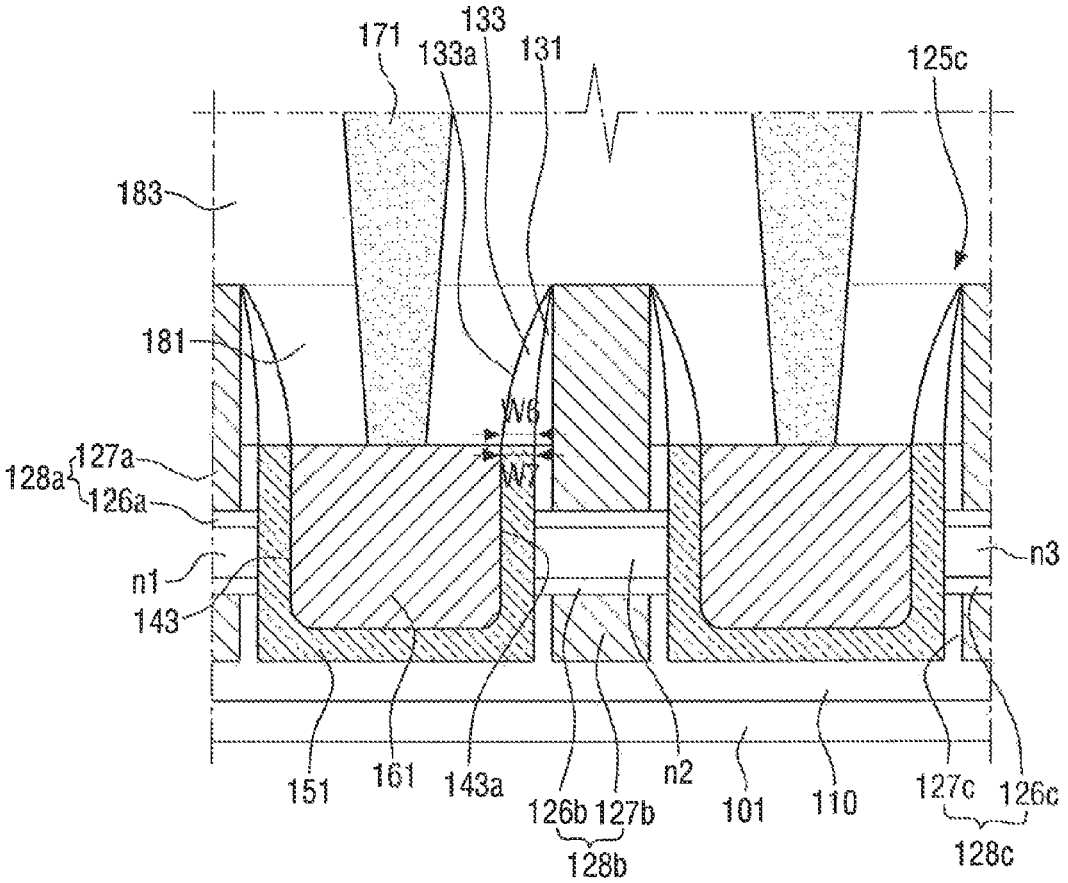
FIG. 9 is a cross-sectional view taken along line A-A of FIG. 8.

FIG. 8 is a perspective view of a semiconductor device 4 according to an exemplary embodiment of the present inventive concept, and FIG. 9 is a cross-sectional view taken along line A-A of FIG. 8. In FIG. 8, first and second interlayer insulation layers 181 and 183 are not shown for the convenience of description.

The semiconductor device 4 shown in FIG. 8 includes a substrate 101, a field insulation layer 110, first to third gate structures 128a, 128b and 128c, a source/drain region 161, a contact 171, and first to third nano wires n1, n2 and n3.

The semiconductor device 4 may be referred to as a gate-all-round device and include nano wires n1, n2 and n3, instead of the first fin F1 of FIGS. 1 to 7.

The substrate 101 may be, for example, a silicon on insulator (SOI) substrate. The field insulation layer 110 is formed on the substrate 101.

The first to third gate structures 128a, 128b and 128c may be disposed on the field insulation layer 110 to be spaced apart from one another. In FIG. 8, the first to third gate structures 128a, 128b and 128c are spaced apart from one another in a second direction Y1. The present inventive concept, however, is not limited thereto. For example, the first to third gate structures 128a, 128b and 128c may be spaced apart from one another in a first direction X1.

The first to third gate structures 128a, 128b and 128c surround the first to third nano wires n1, n2 and n3, respectively. Therefore, in view of a cross section taken along line B-B, the first to third gate structures 128a, 128b and 128c are disposed on both sides of the first to third nano wires n1, n2 and n3, respectively. For example, each of the first to third nano wires n1, n2 and n3 penetrates each of the first to third gate structures 128a, 128b and 128c along the second direction Y1.

In FIG. 8, the first to third nano wires n1, n2 and n3 each has a circular cross section. Alternatively, cross sections of the first to third nano wires n1, n2 and n3 may be oval, rectangular or square shapes.

The first to third gate structures 128a, 128b and 128c may include first to third gate insulation layers 126a, 126b and 126c and first to third gate electrodes 127a, 127b and 127c, respectively.

The first to third gate insulation layers 126a, 126b and 126c surround the first to third nano wires n1, n2 and n3. The first to third gate insulation layers 126a, 126b and 126c are pipe-shaped, extending in the second direction Y1.

The first to third gate electrodes 127a, 127b and 127c surround the first to third gate insulation layers 126a, 126b and 126c, respectively. A first spacer 131 and a second spacer 133 are sequentially formed on both sidewalk of the first to third gate electrodes 127a, 127b and 127c.

A source/drain region 151 is formed in regions between two neighboring gate electrodes of the first to third gate electrodes 127a, 127b and 127c and is spaced apart from the first to third gate electrodes 127a, 127b and 127c by the first spacer 131 and the field insulation layer 110. The source/drain region 151 is in contact with the first to third nano wires n1, n2 and n3.

A top surface of the source/drain region 151 is in contact with the second spacer 133, and a width W7 of the top surface of the source/drain region 151 is substantially equal to a width W6 of a bottom surface of the second spacer 133. A side surface 143a of the source/drain region 151 is connected to a side surface 133a of the second spacer 133 without forming a step at the boundary between the source/drain region 151 and the second spacer 133. Alternatively, the width W7 of the top surface of the source/drain region 151 may be smaller than the width W6 of the bottom surface of the second spacer 133. In this case, the side surface 143a of the source/drain region 151 may be connected to the side surface 133a of the second spacer 133 forming a step at the boundary of the source/drain region 151 and the second spacer 133.

The source/drain region 151 defines a first recess 143, and a silicide layer 161 is disposed in the first recess 143. For example, the silicide layer 161 fills the first recess 143 and is disposed between two neighboring nano wires of the first to third nano wires n1, n2 and n3. A thickness of the silicide layer 161 is greater than thicknesses of the first to third nano wires n1, n2 and n3.

A contact 171 is formed on the silicide layer 161, and first and second interlayer insulating layers 181 and 183 cover side surfaces of the contact 171.

Hereinafter, a semiconductor device according to an exemplary embodiment of the present inventive concept will be described with reference to FIGS. 10 and 11. For the convenience of description, description of the same elements as in the semiconductor device 1 of FIG. 1 will be omitted.

Figure 10:
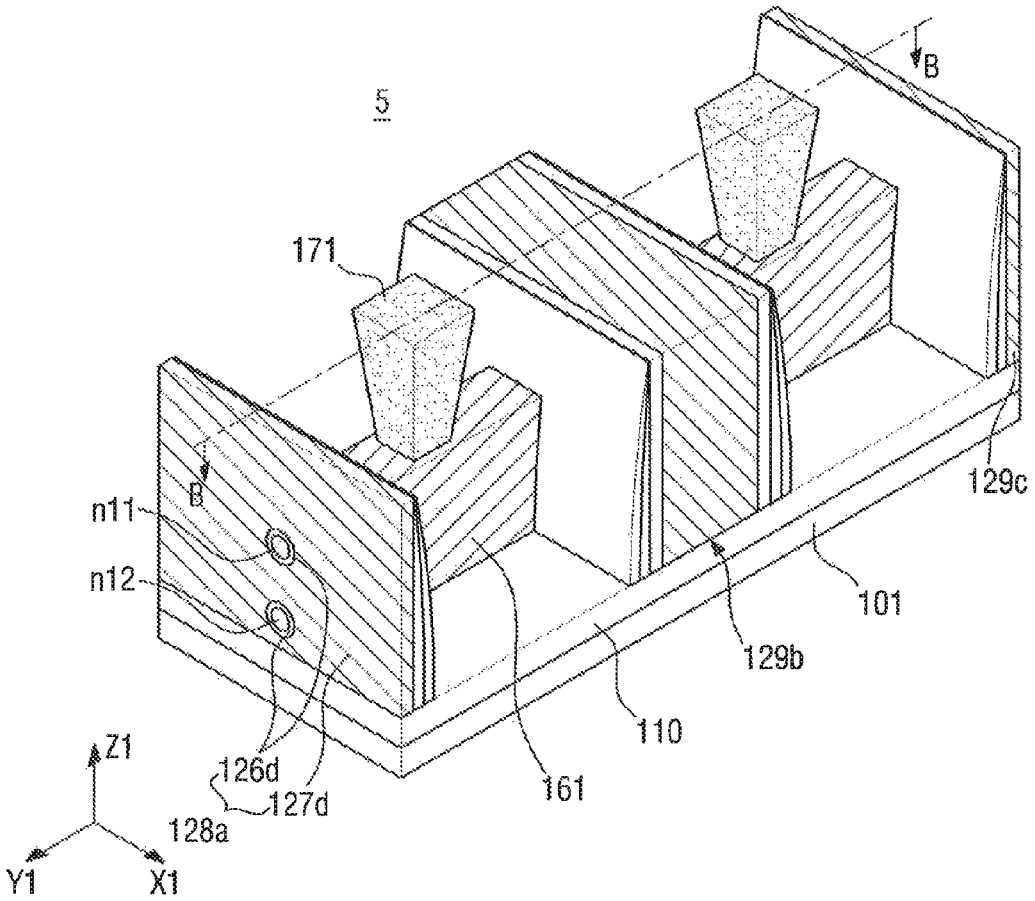
FIG. 10 is a perspective view of a semiconductor device according to an exemplary embodiment of the present inventive concept.

FIG. 10 is a perspective view of a semiconductor device 5 according to an exemplary embodiment of the present inventive concept. For the convenience of description, first and second interlayer insulation layers 181 and 183 are not shown.

The semiconductor device 5 shown in FIG. 10 includes two nano wires n11 and n12 vertically stacked on each other. The two nano wires n11 and n12 are surrounded by a single gate structure 129a.

A source/drain region 151 may be in contact with at least one of the two nano wires n11 and n12. Current flows may be formed through the at least one nano wire that is in contact with the source/drain region 151. An amount of driving current may be determined by the number of nano wires n11 and n12 that is in contact with the source/drain region 151. For example, assuming that one nano wire flows a current amount of j, two nano wires flow a current amount of 2j.

Figure 11:
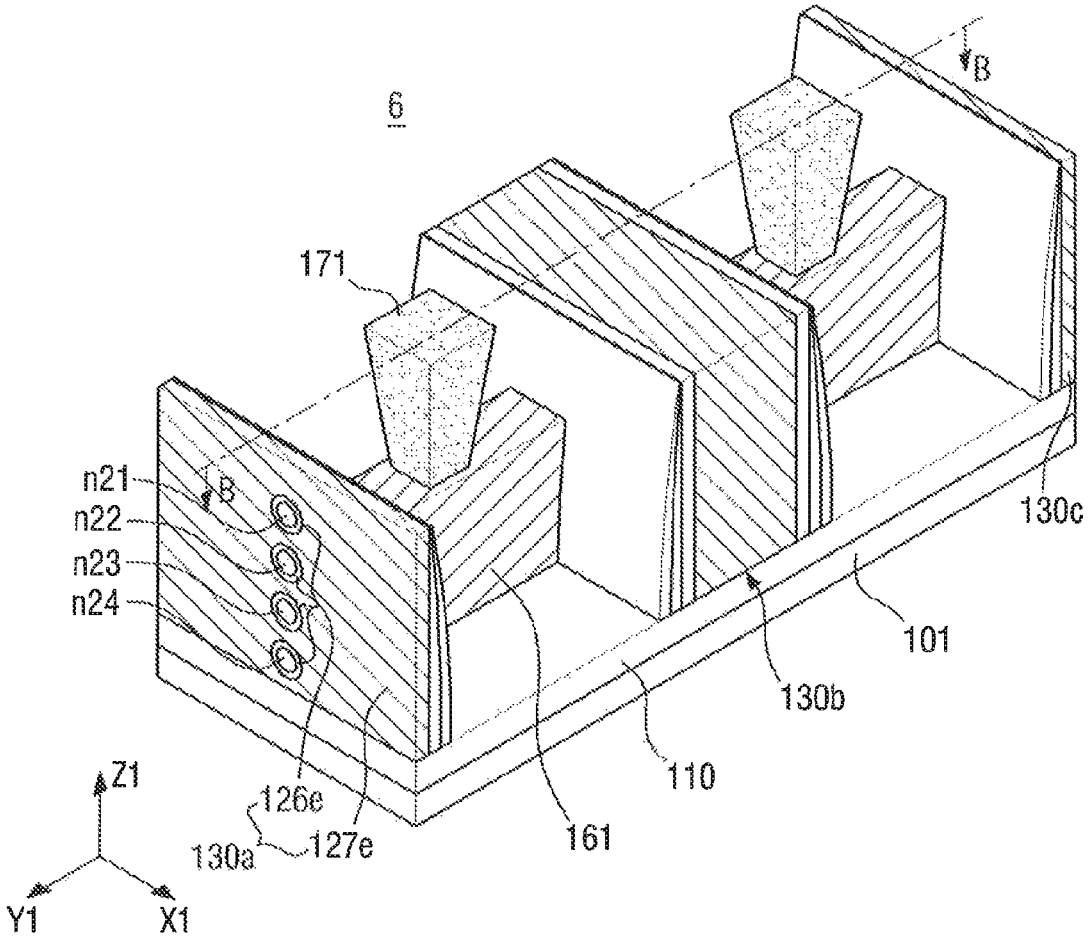
FIG. 11 is a cross-sectional view taken along line A-A of FIG. 10.

Referring to FIG. 11, the semiconductor device 6 includes four nano wires n21, n22, n23 and n24 vertically stacked on each other. First and second interlayer insulation layers 181 and 183 are not shown for the convenience of description.

In FIG. 11, an amount of driving current may be determined by the number of nano wires n21, n22, n23 and n24 that are in contact with a source/drain region 151. For example, assuming that two nano wires flows a current amount of 2j, three nano wires flow a current amount of 3j. The number of nano wires is not limited thereto, and it may be greater than four.

Next, a semiconductor memory device including a semiconductor device according to an exemplary embodiment of the present inventive concept will be described with reference to FIGS. 12 and 13.

Figure 12:
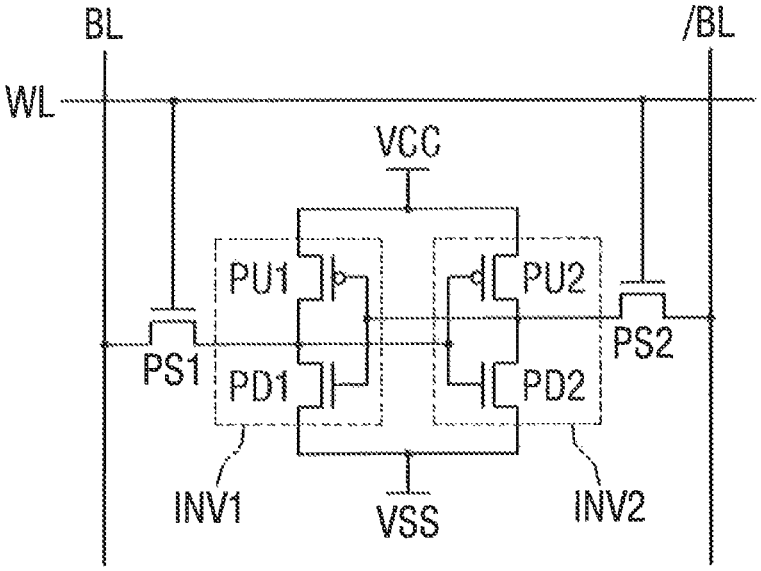
FIGS. 12 and 13 are a circuit diagram and a layout corresponding to the circuit diagram of a semiconductor device according to an exemplary embodiment of the present inventive concept.
Figure 13:
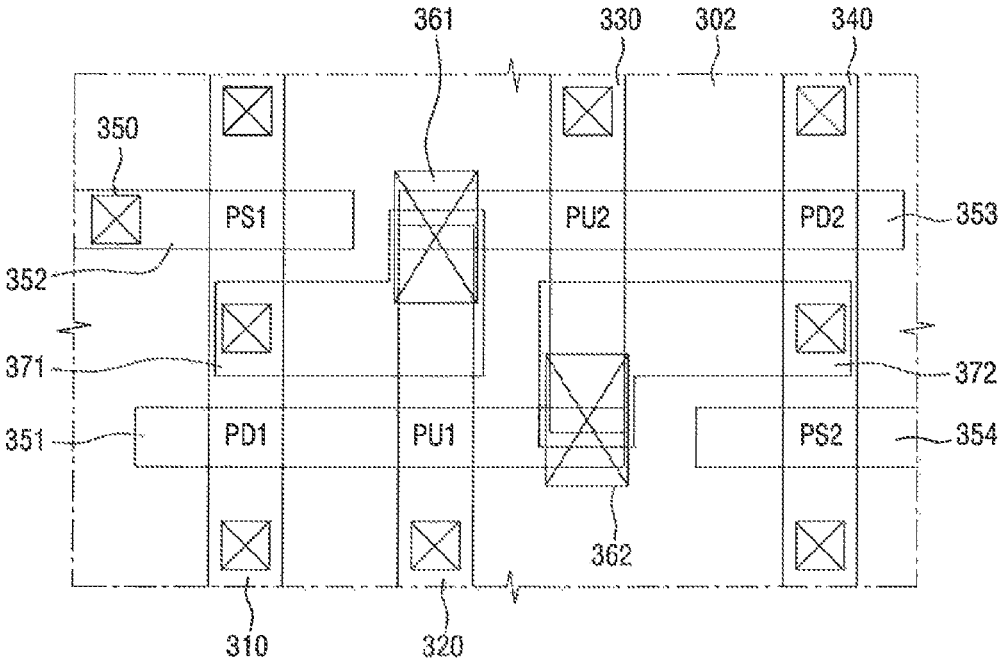

FIGS. 12 and 13 are a circuit diagram and a layout illustrating a semiconductor memory device including a semiconductor device according to an exemplary embodiment of the present inventive concept.

For example, the semiconductor memory device of FIG. 12 includes a static random access memory (SRAM) cell having a fin type semiconductor device according to an exemplary embodiment of the present inventive concept. The inventive concept is not limited thereto, and may also be applied to other semiconductor devices.

First, referring to FIG. 12, the semiconductor device includes a pair of inverters INV1 and INV2 connected in parallel between a power supply node Vcc and a ground node Vss. A first pass transistor PS1 and a second pass transistor PS2 are connected to output nodes of the inverters INV1 and INV2. The first pass transistor PS1 and the second pass transistor PS2 are connected to a bit line 13L and a complementary bit line BL/. Gates of the first pass transistor PS1 and the second pass transistor PS2 are connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 are PMOS transistors, and the first pull-down transistor PD1 and the second pull-down transistor PD2 are NMOS transistors.

In addition, the first inverter INV1 is cross-coupled to the second inverter INV2 to form a latch circuit. For example, an input node of the first inverter INV1 is connected to an output node of the second inverter INV2 and an input node of the second inverter INV2 is connected to an output node of the first inverter INV1.

Referring to FIGS. 12 and 13, a first fin 310, a second fin 320, a third fin 330 and a fourth fin 340, which are spaced apart from one another, extends lengthwise in one direction (e.g., in an up-and-down direction of FIG. 13). The second fin 320 and the third fin 330 may extend in smaller lengths than the first fin 310 and the fourth fin 340 in the layout corresponding to the SRAM cell of FIG. 12.

In addition, a first gate electrode 351, a second gate electrode 352, a third gate electrode 353, and a fourth gate electrode 354 are formed to extend in the other direction (for example, in a left-and-right direction of FIG. 13) to intersect the first fin 310 to the fourth fin 340. For example, the first gate electrode 351 completely intersects the first fin 310 and the second fin 320 while partially overlapping with a terminal of the third fin 330. The third gate electrode 353 completely intersects the fourth fin 340 and the third fin 330 while partially overlapping with a terminal of the second fin 320. The second gate electrode 352 and the fourth gate electrode 354 are formed to intersect the first fin 310 and the fourth fin 340, respectively.

The first pull-up transistor PU1 is formed in an intersection of the first gate electrode 351 and the second fin 320, the first pull-down transistor PD1 is formed in an intersection of the first gate electrode 351 and the first fin 310, and the first pass transistor PS1 is formed in an intersection of the second gate electrode 352 and the first fin 310. The second pull-up transistor PU2 is formed in an intersection of the third gate electrode 353 and the third fin 330, the second pull-down transistor PD2 is formed in an intersection of the third gate electrode 353 and the fourth fin 340, and the second pass transistor PS2 is formed in an intersection of the fourth gate electrode 354 and the fourth fin 340.

Recesses may be formed in regions between two neighboring intersections of the first to fourth gate electrodes 351-354 and the first to fourth fins 310, 320, 330 and 340. Sources/drains may be formed in the recesses.

In addition, a plurality of contacts 350 may be formed in the recesses.

Further, a shared contact 361 is formed at a region where the second fin 320, the third gate electrode 353 and a wire 371 are connected to each other. A shared contact 362 is formed at a region where the third fin 330, the first gate electrode 351 and a wire 372 are connected to each other.

The first pull-tip transistor PU1 and the second pull-up transistor PU2 may include a semiconductor device according to an exemplary embodiment of the present inventive concept.

Figure 14:
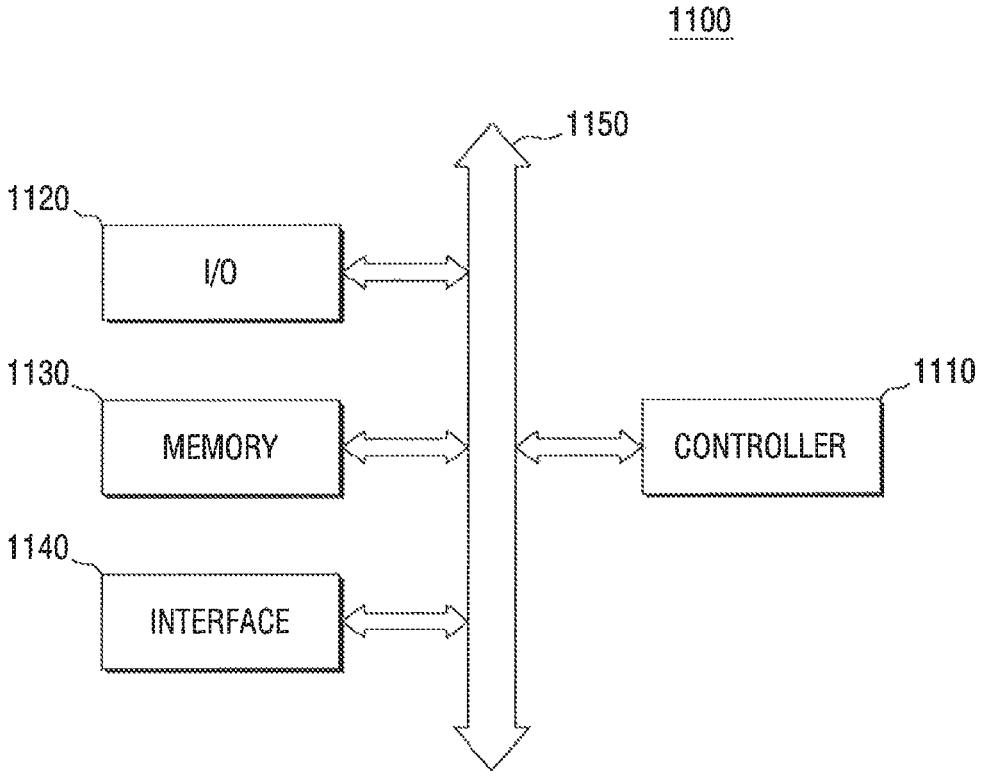
FIG. 14 is a block diagram of an electronic system including an exemplary semiconductor device according to the present inventive concept.

FIG. 14 is a block diagram of an exemplary electronic system including a semiconductor device according to an exemplary embodiment of the present inventive concept.

Referring to FIG. 14, the electronic system 1100 includes a controller 1110, an input/output device (I/O) 1120, a memory device 1130, an interface 1140 and a bus 1150. The controller 1110, the I/O 1120, the memory device 1130, and/or the interface 1140 are connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a keypad, a keyboard, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed dynamic random access memory (DRAM) and/or SRAM devices as a working memory for operating the controller 1110. The memory device 1130 may include a semiconductor device according to an exemplary embodiment of the inventive concept. The controller 1110 and/or the I/O 1120 may include a semiconductor device according to an exemplary embodiment of the inventive concept.

The electronic system 1100 may be applied to a personal digital assistant (FDA), a portable computer, a web tablet, a wireless phone, a mobile phone, a digital music player, a memory card, or any type of electronic device capable of transmitting and/or receiving information in a wireless environment.

Figure 15:
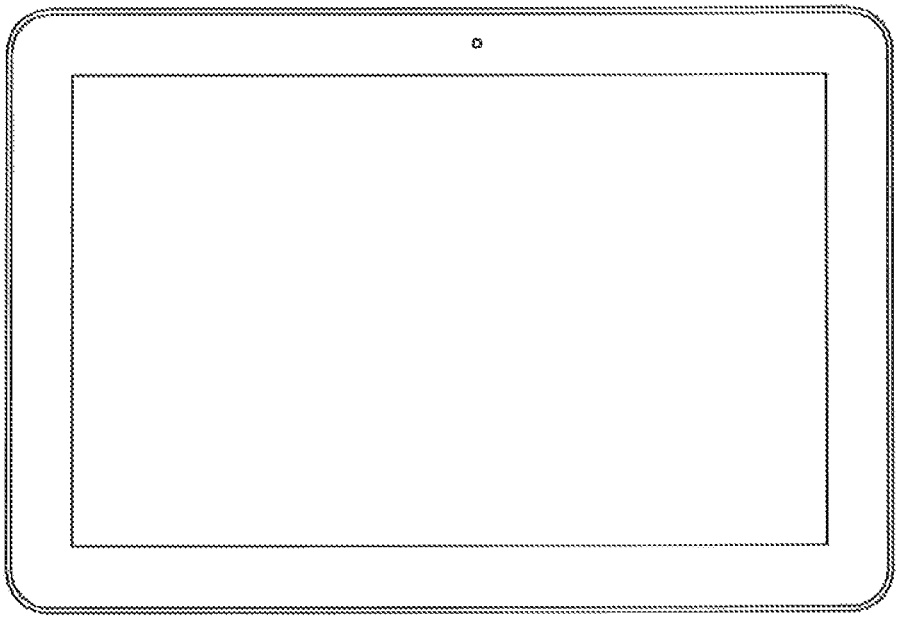
FIGS. 15 and 16 illustrate exemplary semiconductor systems having an exemplary semiconductor device according to the present inventive concept.
Figure 16:
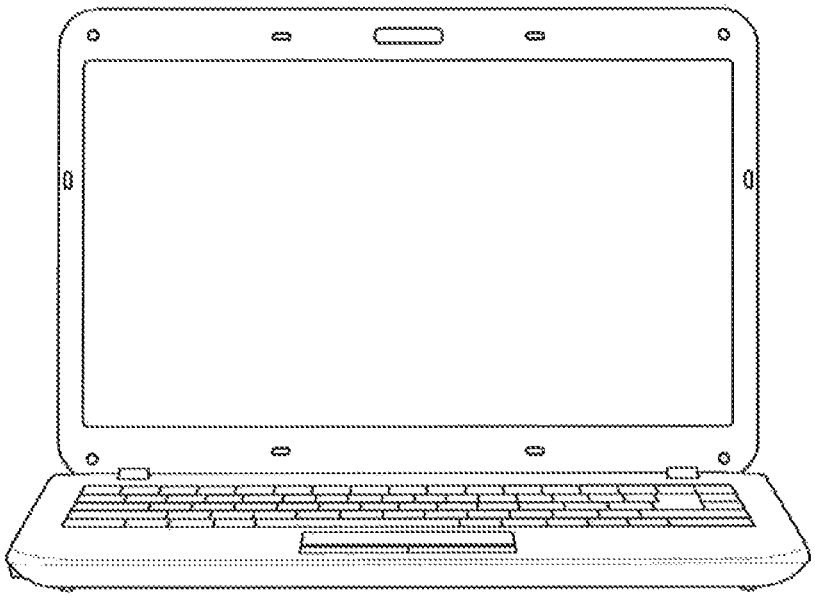

FIGS. 15 and 16 illustrate exemplary semiconductor systems including a semiconductor device according to an exemplary embodiment of the present inventive concept. FIG. 15 illustrates an exemplary tablet PC including a semiconductor device according to an exemplary embodiment of the inventive concept, and FIG. 16 illustrates an exemplary notebook computer including a semiconductor device according to an exemplary embodiment of the inventive concept. The inventive concept is not limited thereto, and other electronic devices may include a semiconductor device according to an exemplary embodiment of the present inventive concept.

Hereinafter, a method for fabricating a semiconductor device according to an exemplary embodiment of the present inventive concept will be described with reference to FIGS. 17 to 27. Descriptions of the same content as described above will not be repeated, and the following description will focus on differences.

FIGS. 17 to 27 illustrate intermediate process steps of a method for fabricating a semiconductor device according to an exemplary embodiment of the present inventive concept. FIGS. 17 to 20 are perspective views of the semiconductor device according to an exemplary embodiment of the present inventive concept, and FIGS. 21 to 27 are cross-sectional views of the semiconductor device according to an exemplary embodiment of the present inventive concept.

Figure 17:
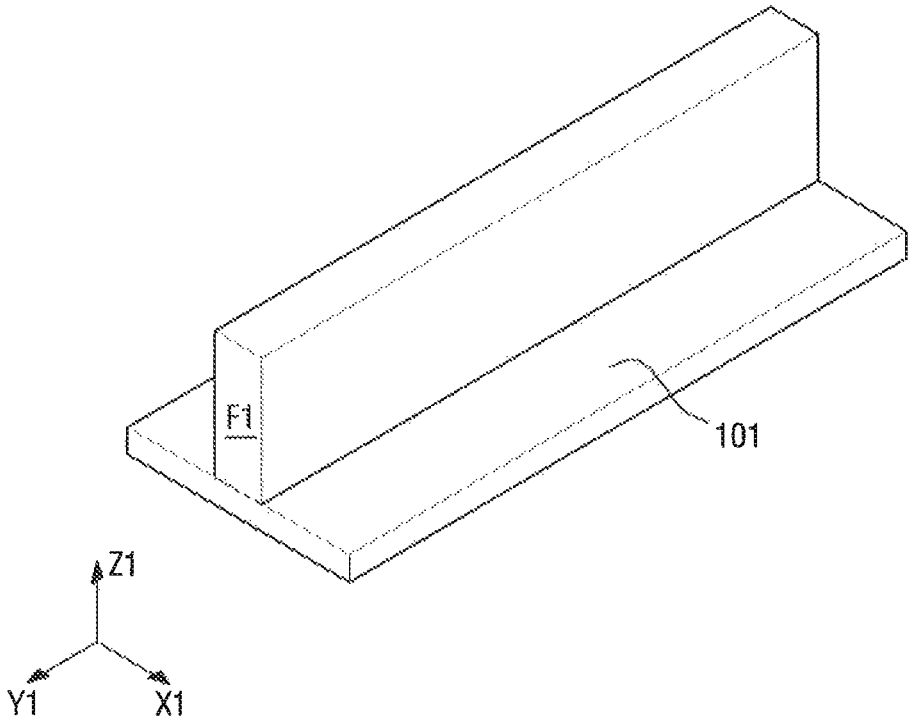
FIGS. 17 to 27 illustrate a method for fabricating a semiconductor device according to an exemplary embodiment of the present inventive concept.

Referring to FIG. 17, a preliminary fin F1 is formed on a substrate 101, protruding in a third direction Z1. The preliminary fin F1 extends in a lengthwise direction, for example, in a second direction Y1. Therefore, the preliminary fin F1 has long sides extending in the second direction and short sides extending in a first direction X1, but the present inventive concept is not limited thereto. For example, the long side direction may be the first direction X1 and the short side direction may be the second direction Y1.

The preliminary fin F1 may be part of the substrate 101 or may include an epitaxial layer grown from the substrate 101. The preliminary fin F1 may include, for example, Si or SiGe.

Figure 18:
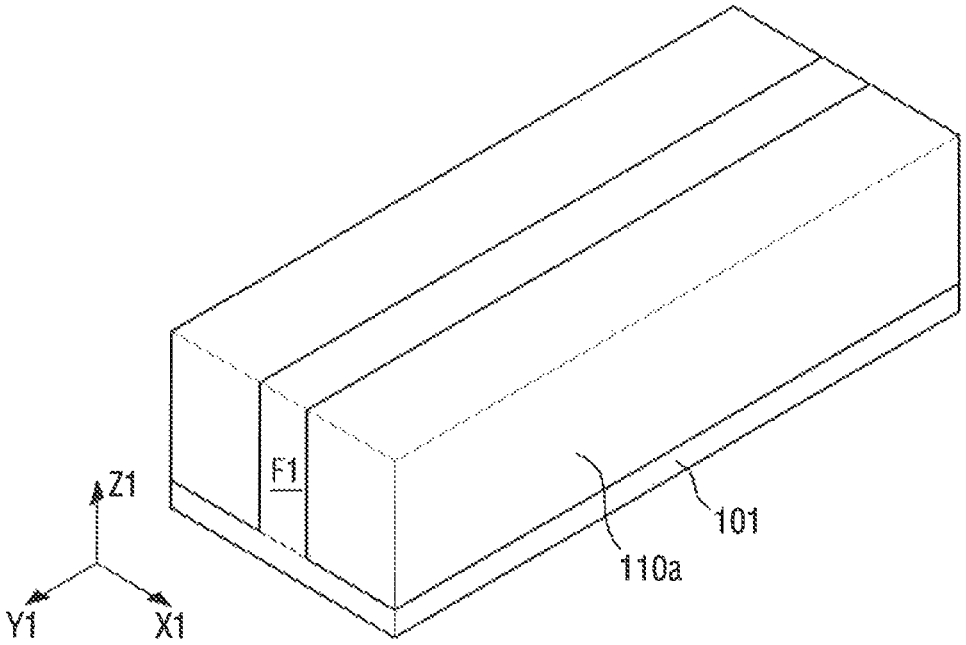

Referring to FIG. 18, an insulation layer 110a is formed to cover sidewalls of the preliminary fin F1. The insulation layer 110a may include at least one of a silicon oxide layer, a silicon nitride layer, and a silicon oxynitride layer.

Figure 19:
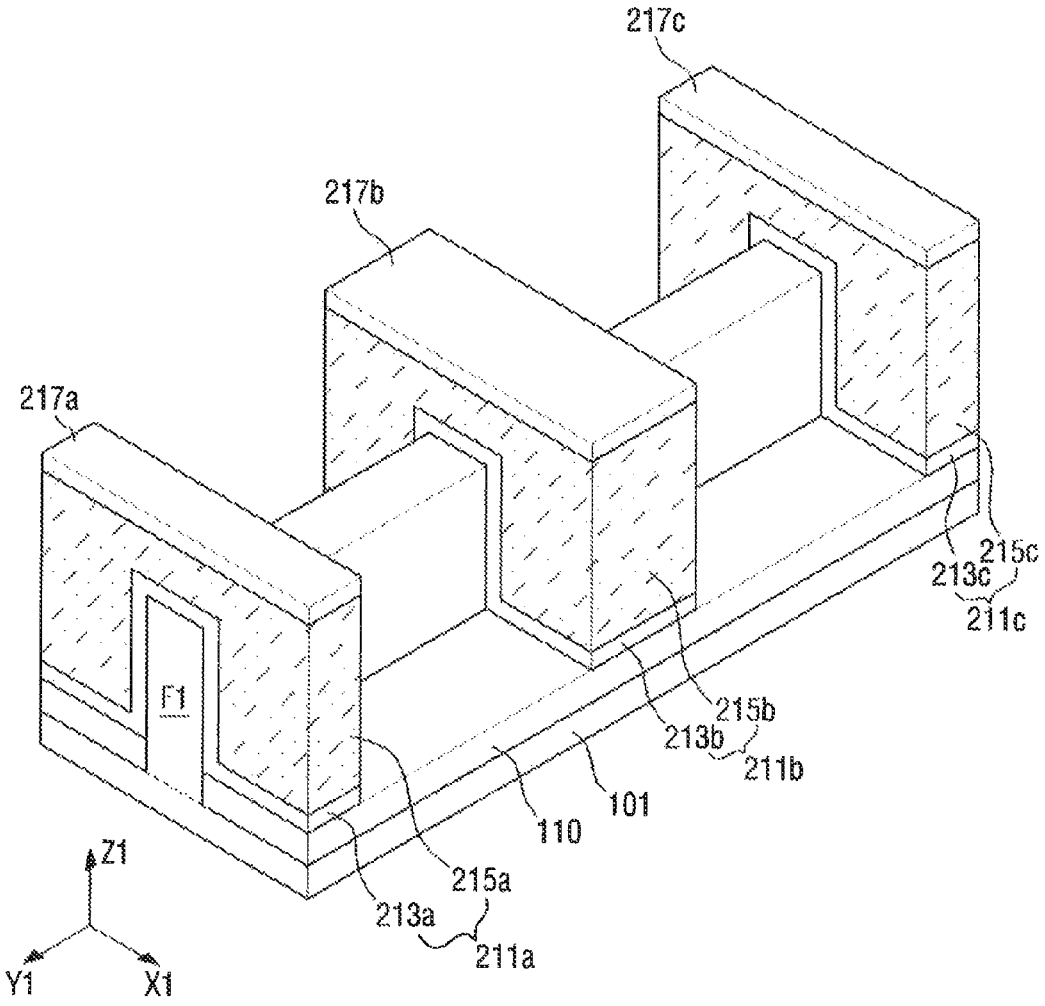

Referring to FIG. 19, a field insulation layer 110 is formed by recessing a top portion of the insulation layer 110a and a top portion of the preliminary fin F1 is exposed. The recessing may include selective etching.

Alternatively, a portion of the preliminary fin F1 protruding above the field insulation layer 110 may be formed by an epitaxial process. For example, after forming the insulation layer 110a, the portion of the preliminary fin F1 may be formed by an epitaxial process using a top surface of the preliminary fin F1 exposed by the insulation layer 110a as a seed without recessing the insulation layer 110a.

In addition, impurities may be doped in the exposed preliminary fin F1 to adjust a threshold voltage. For example, in a case of forming an NMOS transistor, doped impurities may be boron (B), and in a case of forming a PMOS transistor, doped impurities may be phosphorus (F) or arsenic (As).

Next, first to third dummy gate structures 211a, 211b and 211c crossing the fin F1 are formed on the fin F1. The first to third dummy gate structures 211a, 211b and 211c are spaced apart from one another. In FIG. 19, the first to third dummy gate structures 211a, 211b and 211c cross the preliminary fin F1 at right single in a first direction X1. However, the present inventive concept is not limited thereto. The first to third dummy gate structures 211a, 211b and 211c may cross the preliminary fin F1 at an acute angle and/or an obtuse angle with respect to a second direction Y1.

The first to third dummy gate structures 211a, 211b and 211c include first to third dummy gate insulation layers 213a, 213b and 213c and first to third dummy gate electrodes 215a, 215b and 215c, respectively.

The first to third dummy gate insulation layers 213a, 213b and 213c and the first to third dummy gate electrodes 215a, 215b and 215c may be sequentially stacked one on another.

The first to third dummy gate insulation layers 213a, 213b and 213c are conformally formed on a top surface and top portions of the sidewalls of the preliminary fin F1. In addition, the first to third dummy gate insulation layers 213a, 213b and 213c is positioned between the first to third dummy gate electrodes 215a, 215b and 215c and the field insulation layer 110, respectively.

The first to third dummy gate electrodes 215a, 215b and 215c are formed on the first to third dummy gate insulation layers 213a, 213b and 213c, respectively.

For example, the first to third dummy gate electrodes 215a, 215b and 215c may include silicon oxide, and the first to third dummy gate insulation layers 213a, 213b and 213c may include polysilicon.

The first to third hard mask layers 217a, 217b and 217c are formed on the first to third dummy gate structures 211a, 211b and 211c, respectively. The first to third dummy hard mask layers 217a, 217b and 217c may include at least one of a silicon oxide layer, a silicon nitride layer and a silicon oxynitride layer.

Figure 20:
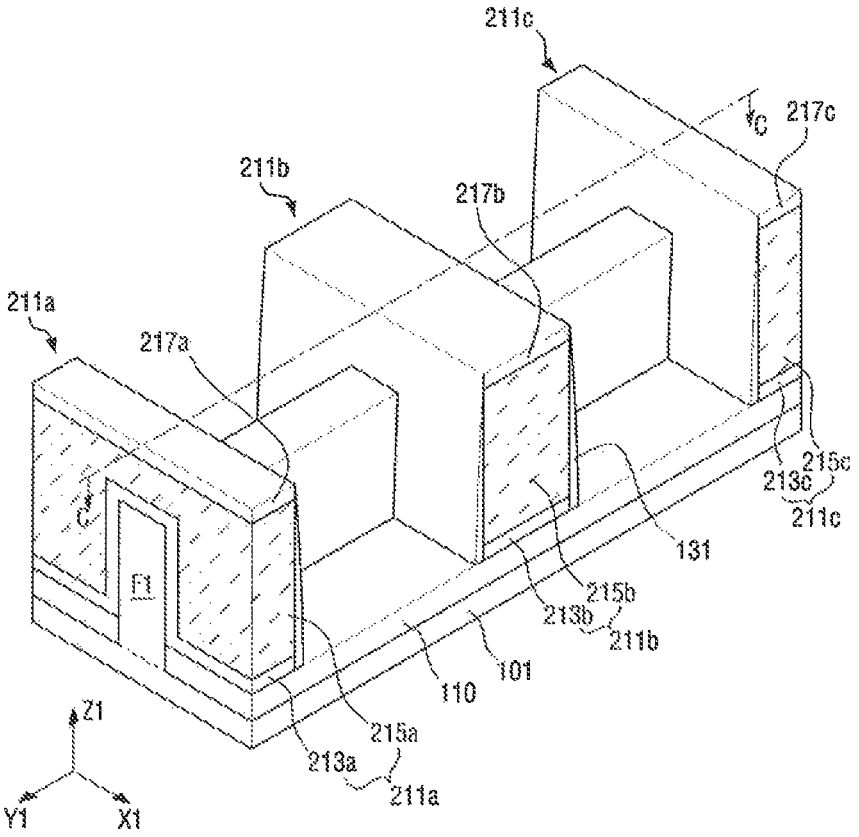
Figure 21:
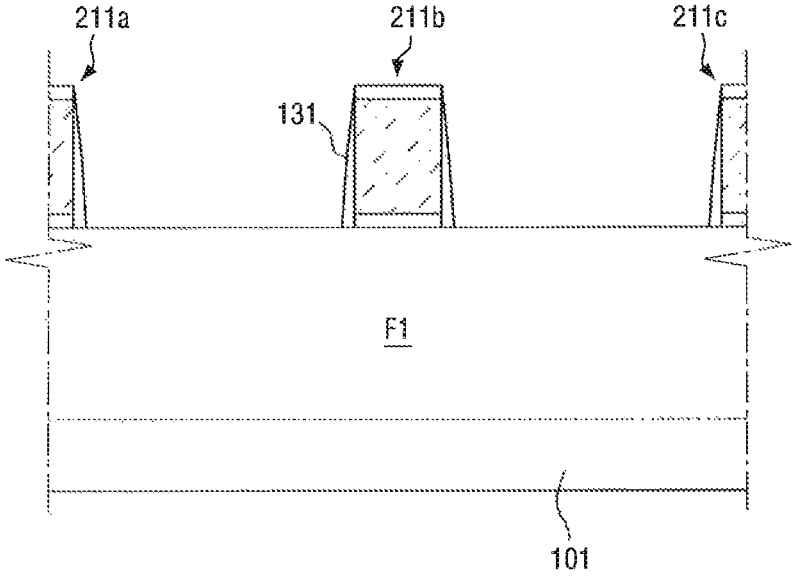

Referring to FIGS. 20 and 21, a first spacer 131 is formed on both sidewalls of each of the first to third dummy gate structures 211a, 211b and 211c. The first spacer 131 may expose top surfaces of the first to third hard mask layers 217a, 217b and 217c. The first spacer 131 may include a silicon nitride layer or a silicon oxynitride layer.

Figure 22:
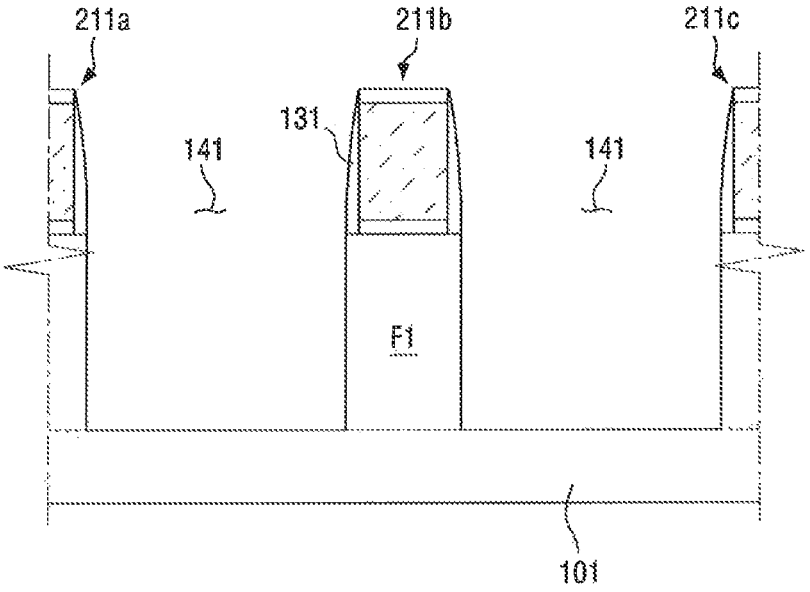

Referring to FIG. 22, a trench 141 is formed in the preliminary fin F1 to form a fin F1. The trench 141 may be formed using the first spacer 131 and the first to third hard mask layers 217a, 217b and 217c as etch masks. The trench 141 may be formed by etching the preliminary fin F1 exposed without being covered by the first spacer 131 and the first to third dummy gate structures 211a, 211b and 211c. The trench 141 is self aligned by the first spacer 131. As shown in FIG. 22, the trench 141 may be formed by etching the fin F1 to expose a top surface of the substrate 101.

Figure 23:
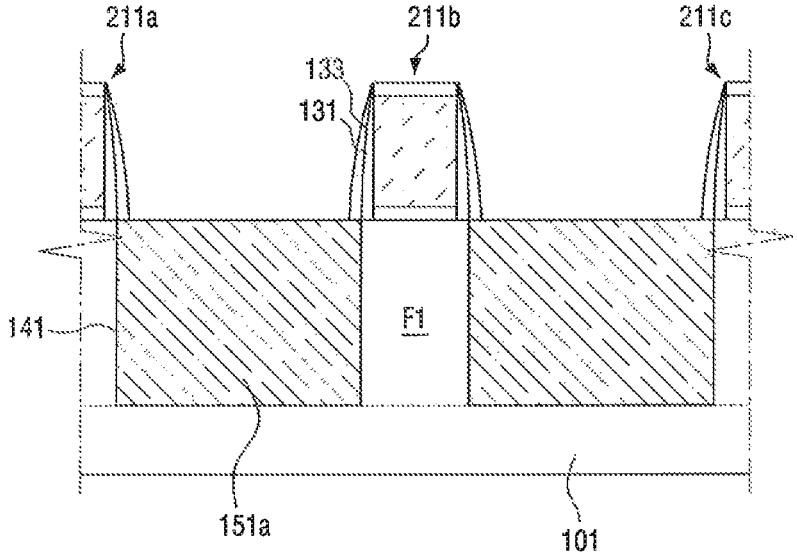

Referring to FIG. 23, a preliminary source/drain region 151a is formed in the trench 141. The source/drain region 151a may be formed by epitaxial growth.

Next, a second spacer 133 is formed on sidewalls of the first spacer 131, covering a portion of the preliminary source/drain region 151a. A thickness of the portion in the preliminary source/drain region 151a may be determined by a width of the second spacer 133.

Figure 24:
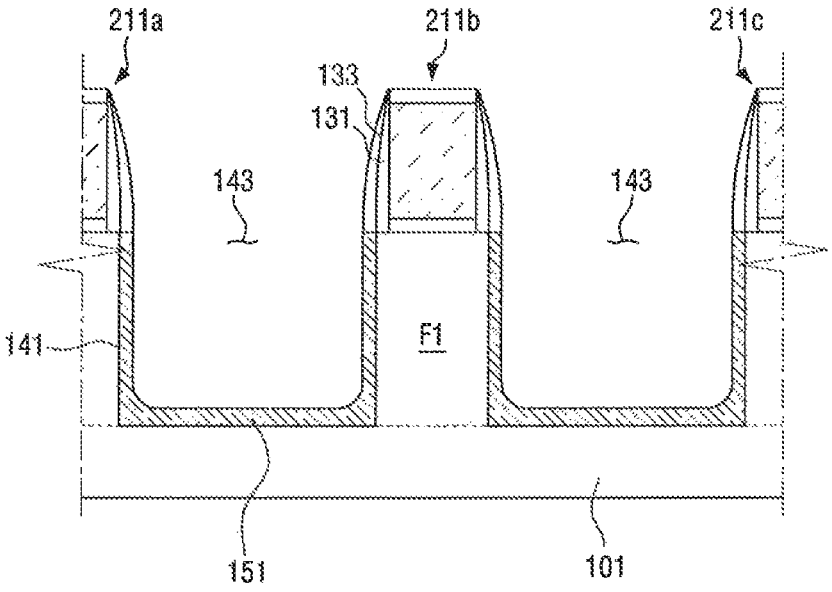

Referring to FIG. 24, the preliminary source/drain region 151a is etched to form a first recess 143 and a source/drain region 151. The first recess 143 is defined by the source/drain region 151 having a U shape. The first recess 143 may be formed by etching the preliminary source/drain region 151a using the second spacer 133 and the first to third dummy gate structures 211a, 211b and 211c as etch masks. Therefore, the first recess 143 is self aligned with the second spacer 133. For example, an outer surface of the second spacer 133 is connected with an outer surface of the second spacer 133. In addition, the second spacer 133 and the source/drain region 151 are in contact with each other.

Figure 25:
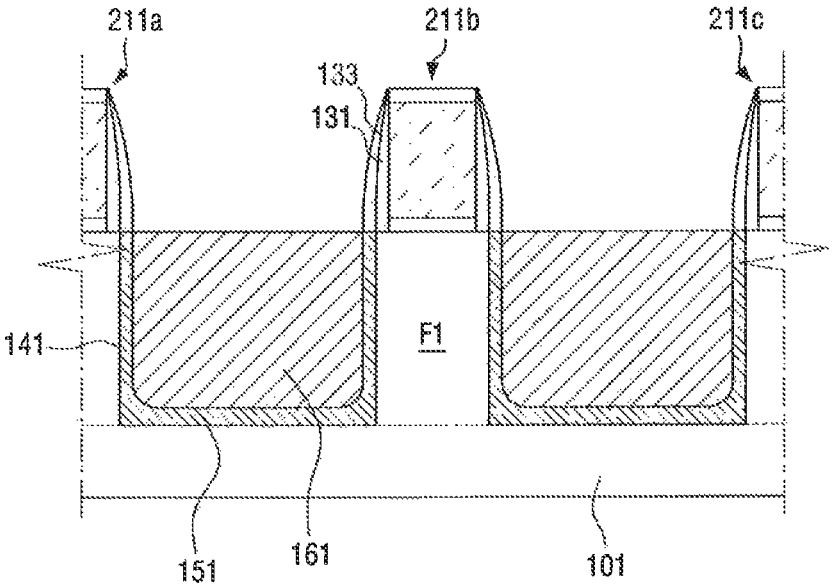

Referring to FIG. 25, a silicide layer 161 is formed in the first recess 143. Since the silicide layer 161 is formed in the first recess 143, a distance between the top surface of the substrate 101 and a bottom surface of the silicide layer 161 is smaller than a distance between the top surface of the substrate 101 and the top surface of the fin F1.

Figure 26:
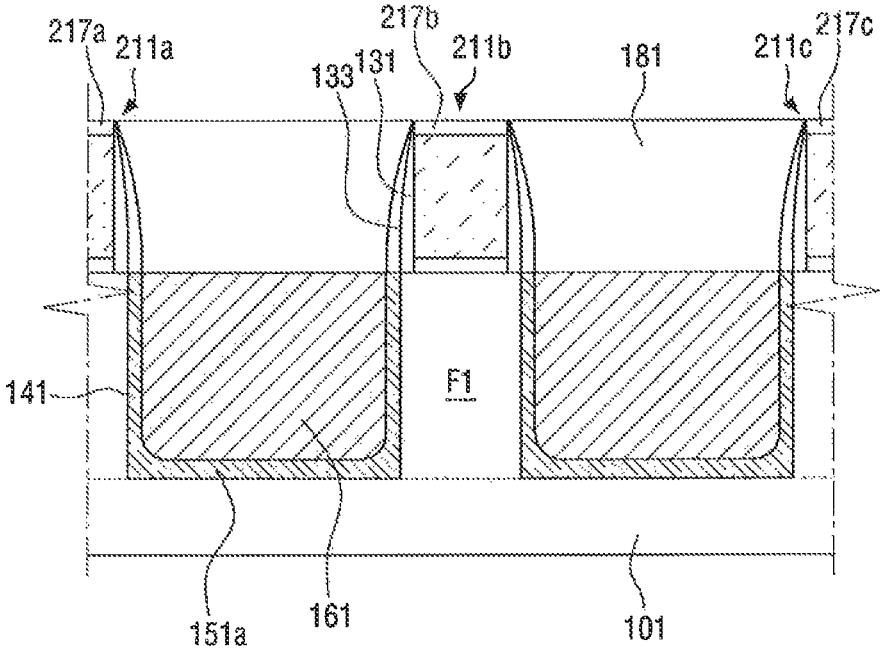

Referring to FIG. 26, a first interlayer insulation layer 181 is formed on the silicide layer 161. The first interlayer insulation layer 181 exposes the first to third hard mask layers 217a, 217b and 217c.

Figure 27:
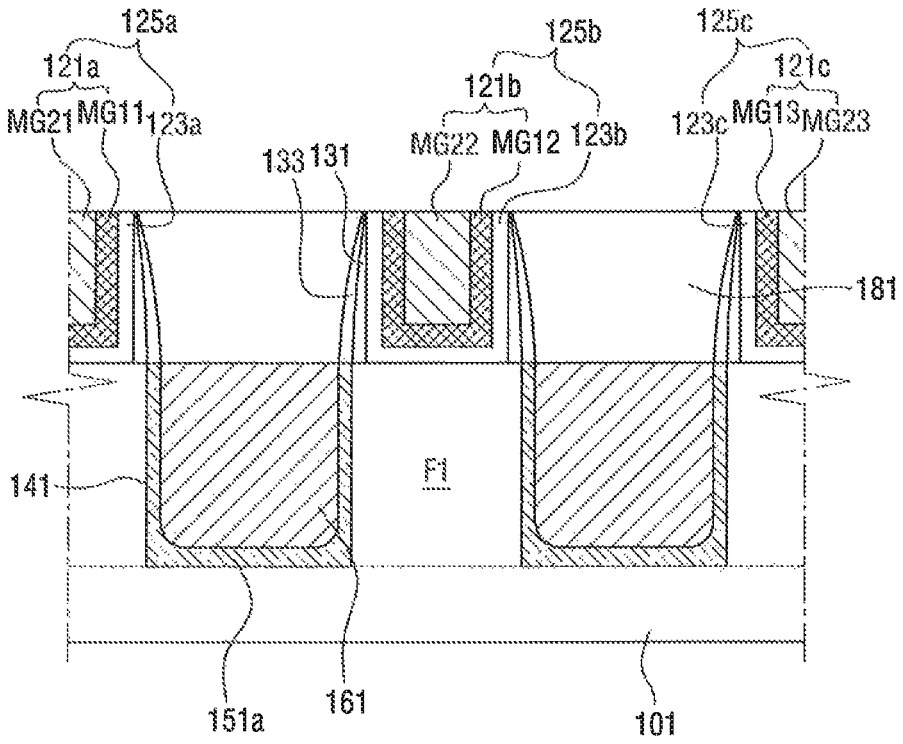

Referring to FIG. 27, the first to third dummy gate structures 211a, 211b and 211c are replaced by first to third gate structures 125a, 125b and 125c. First, the first to third hard mask layers 217a, 217b and 217c are removed by using a planarization process (e.g., CMP), thereby exposing the first to third dummy gate structures 211a, 211b and 211c. Next, the exposed first to third dummy gate structures 211a, 211b and 211c are removed and then, the first to third gate structures 125a, 125b and 125c are formed in the regions where the first to third dummy gate structures 211a, 211b and 211c were formed. The first to third gate structures 125a, 125b and 125c include first to third gate insulation layers 123a, 123b and 123c and first to third gate electrodes 121a, 121b and 121c sequentially stacked, respectively.

Next, referring back to FIG. 2, a second interlayer insulation layer 183 is formed on the resultant product of FIG. 27, and a contact 171 penetrating through the first and second interlayer insulation layers 181 and 183 is formed to be in contact with the silicide layer 161, thereby fabricating the semiconductor device 1 as shown in FIG. 1.

Alternatively, top portions of the first to third gate structures 125a, 125b and 125c may be partially removed, and then first to third capping layers 191, 193 and 195 may be formed on the first to third gate structures 125a, 125b and 125c, respectively. The second interlayer insulation layer 183 may be formed on the first interlayer insulation layer 181 and the first to third capping layers 191, 193 and 195. The contact 171 may then be formed, thereby fabricating the semiconductor device 2 as shown in FIG. 4.

Next, a method for fabricating the semiconductor device 3 of FIG. 6 will be described with reference to FIGS. 17 to 22 and 28 to 30. Descriptions of the same content as described above will not be repeated, and the following description will focus on differences.

Figure 28:
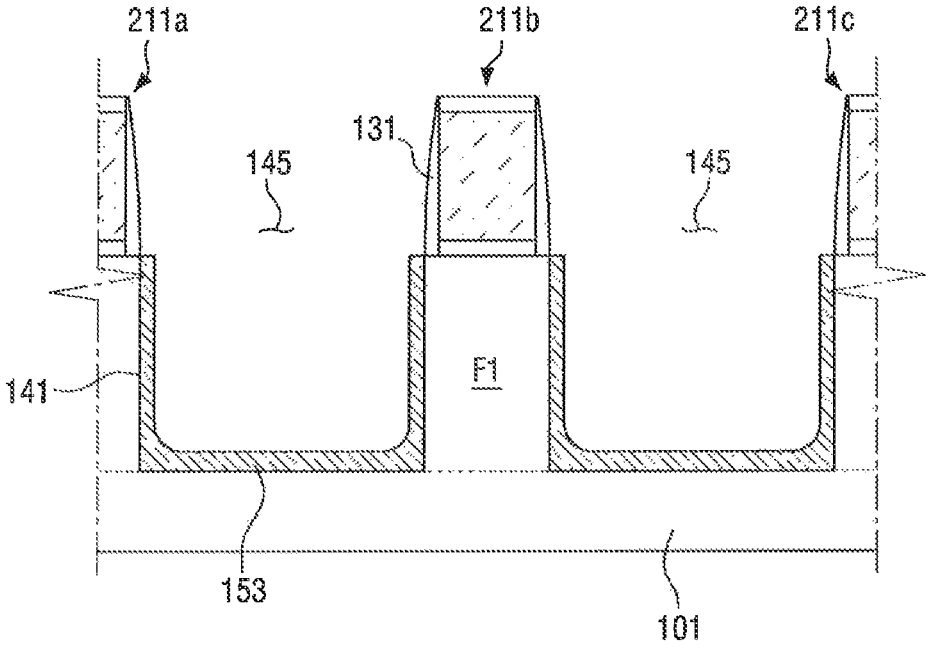
FIGS. 28 to 30 illustrate a method for fabricating the semiconductor device of FIG. 6 according to an exemplary embodiment of the present inventive concept.
Figure 29:
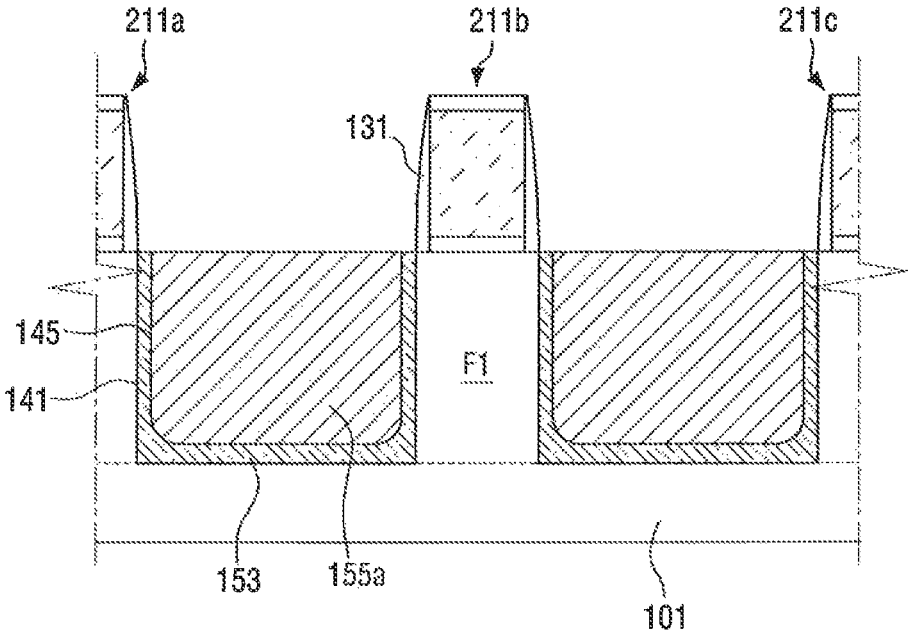
Figure 30:
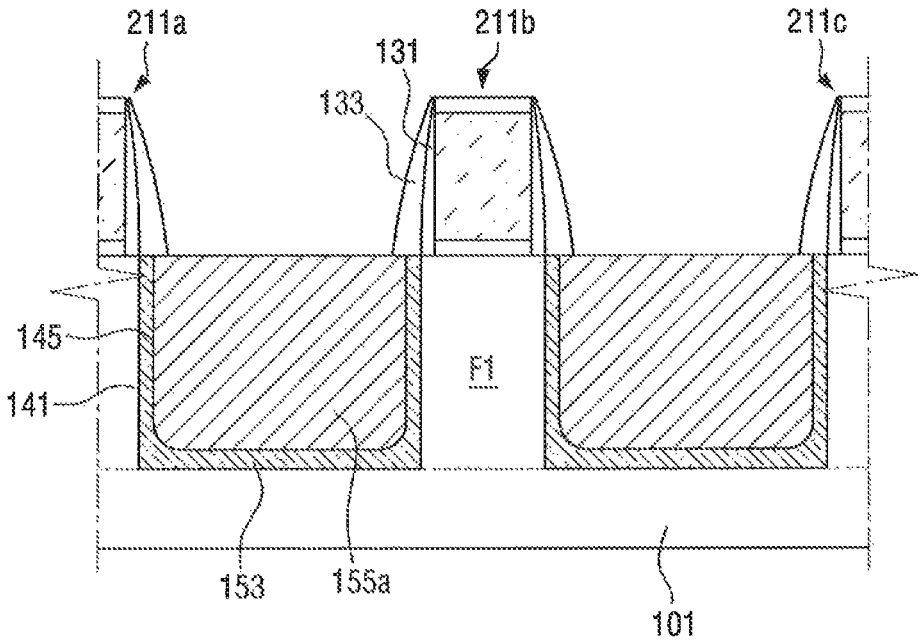

FIGS. 28 to 30 illustrate intermediate process steps of a method for fabricating the semiconductor device 3 of FIG. 6.

Referring to FIG. 28, a first source/drain region 153 including a first material is formed in the trench 141. The formation of the trench 141 is described with reference to FIGS. 17 to 22. For the convenience of a description, the description will be omitted. The first source/drain region 153 may be formed by epitaxial growth. In this case, since the first source/drain region 153 is formed on top surfaces of the fin F1 and the substrate 101, the first source/drain region 153 may have a U shape defining a second recess 145.

Referring to FIG. 29, a preliminary second source/drain region 155a including a first material is formed in the second recess 145. The preliminary second source/drain region 155a may be formed by epitaxial growth.

A concentration of the first material of the first source/drain region 153 may be different from that of the first material of the second source/drain region 155a. For example, the concentration of the first material of the first source/drain region 153 may be smaller than that of the first material of the second source/drain region 155a. The first material may include, for example, Ge.

Next, a second spacer 133 is formed on sidewalls of the first spacer 131. The second spacer 133 is in contact with the first and second source/drain regions 153 and 155a, covering portions of the first source/drain region 153 and the second source/drain region 155a.

Next, the second source/drain region 155a is etched to form a third recess 147 and a second source/drain region 155a, as shown in FIG. 7. A silicide layer 161 is formed in the third recess 147. The first to third dummy gate structures 211a, 211b and 211c are replaced by first to third gate structures 125a, 125b and 125c. A contact 171 is formed on the silicide layer 161, thereby fabricating the semiconductor device 3 of FIG. 6.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device comprising:

a substrate;

a fin disposed on the substrate to extend in a first direction;

a trench disposed on the fin *and including a bottom surface and opposing sidewalls formed by the fin*, wherein the trench is arranged in a straight line along a second direction crossing the first direction;

a gate structure crossing the fin in the [first] *second* direction;

a spacer disposed on sidewalls of the gate structure;

a source/drain region *solely* disposed in *empty space of* the trench *positioned between the opposing sidewalls of the trench*, on at least one side of the gate structure to be disposed in the fin [and], *the source/drain region* including a first recess, a bottom surface of the first recess is nearer to a top surface of the substrate than a top surface of the fin; and a silicide layer filling the first recess.

2. The semiconductor device of claim 1, wherein the source/drain region is U-shaped in view of a cross section taken in the [lengthwise] *first* direction.

3. The semiconductor device of claim 1, wherein the source/drain region is in contact with the substrate.

4. The semiconductor device of claim 1, wherein a bottom surface of the silicide layer is lower than a top surface of the fin.

5. The semiconductor device of claim 1, wherein the spacer includes a first spacer and a second spacer, the first spacer is interposed between the gate structure and the second spacer, and a top surface of the source/drain region is in contact with the second spacer.

6. The semiconductor device of claim 5, wherein a distance between the source/drain region and the gate structure is greater than or equal to a width of a bottom surface of the first spacer.

7. The semiconductor device of claim 5, wherein an outer surface of the second spacer is connected to a surface of the first recess without forming a step at a boundary between the second spacer and the first recess.

8. The semiconductor device of claim 1, wherein the source/drain region includes a first source/drain region and a second source/drain region, wherein the first source/drain region is interposed between the trench and the second source/drain region.

9. The semiconductor device of claim 8, wherein a sum of a width of a top surface of the first source/drain region and a width of a top surface of the second source/drain region is smaller than or equal to a width of a bottom surface of the spacer.

10. The semiconductor device of claim 9, wherein the first source/drain region and the second source/drain region are doped with a first impurity, and a concentration of the first impurity in the first source/drain region is different from that of the first impurity in the second source/drain region.

11. A semiconductor device comprising:

a substrate;

a fin formed on the substrate, wherein the fin includes a first fin protrusion and a second fin protrusion formed on the substrate;

a first recess disposed between the first fin protrusion and the second fin protrusion *and including a bottom surface and opposing sidewalls formed by the fin*, wherein the first recess, the first fin protrusion and the second fin protrusion are arranged in a straight line along a first direction;

a first gate structure and a second gate structure crossing the first fin protrusion and the second fin protrusion in a second direction, respectively;

a first spacer and a second spacer disposed on inner sidewalls of the first gate structure and the second gate structure, respectively, wherein the inner sidewalls face each other through the first recess;

a source/drain region *solely* disposed in *empty space of* the first recess *positioned between the opposing sidewalls of the first recess*, wherein one end of the source/drain region is disposed under the first spacer and another end of the source drain/region is disposed under the second spacer, and a silicide layer disposed on the source/drain region, wherein the silicide layer and the source/drain region fill the first recess.

12. The semiconductor device of claim 11, wherein the source/drain region is U-shaped in view of a cross section taken in the first direction.

13. The semiconductor device of claim 12, wherein the source/drain region is in contact with the substrate.

14. The semiconductor device of claim 11, wherein the source/drain region includes a first source/drain region and a second source/drain region, and wherein the first source/drain region is interposed between the substrate and the second source/drain region.

15. The semiconductor device of claim 11, further comprising a contact disposed on the silicide layer.

*16. A semiconductor device comprising:*

*a substrate;*

*a fin disposed on the substrate to extend in a first direction;*

*a trench disposed on the fin and including a bottom surface and opposing sidewalls formed by the fin, wherein the trench is arranged in a straight line along a second direction crossing the first direction;*

*a plurality of channel patterns spaced apart from the substrate, each of the plurality of channel patterns being spaced apart from each other, the plurality of channel patterns defines at least a portion of the opposing sidewalls of the trench;*

*a gate structure crossing the fin in the second direction and surrounding each of the plurality of channel patterns;*

*a spacer disposed on sidewalls of the gate structure;*

*a source/drain region including metal, the source/drain region is solely disposed in empty space of the trench positioned between the opposing sidewalls of the trench on at least one side of the gate structure to be disposed in the fin and includes a first recess, a bottom surface of the first recess is nearer to a top surface of the substrate than a top surface of the fin; and*

*the metal includes a silicide layer filling the first recess.*

*17. The semiconductor device of claim 16, wherein the metal includes at least one of Pt, Ni and Co.*

*18. The semiconductor device of claim 16, wherein the plurality of channel patterns includes a first channel pattern and a second channel pattern, the first channel pattern is spaced apart from the second channel pattern in the thickness direction of the substrate.*

*19. The semiconductor device of claim 16, wherein he metal is in contact with the plurality of channel patterns.*

*20. The semiconductor device of claim 16, wherein the gate structure surrounds a periphery of each of channel patterns.*

* * * * *